(12) United States Patent
Mizuno

(10) Patent No.: US 7,110,089 B2
(45) Date of Patent: Sep. 19, 2006

(54) DRIVE MECHANISM, EXPOSURE DEVICE, OPTICAL EQUIPMENT, AND DEVICE MANUFACTURING METHOD

(75) Inventor: Makoto Mizuno, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 146 days.

(21) Appl. No.: 10/799,424

(22) Filed: Mar. 11, 2004

(65) Prior Publication Data

US 2004/0189969 A1 Sep. 30, 2004

(30) Foreign Application Priority Data

Mar. 14, 2003 (JP) .............................. 2003-069948

(51) Int. Cl.
*G03B 27/42* (2006.01)
(52) U.S. Cl. ............................ 355/67; 74/470; 74/517; 310/328; 359/819; 385/16
(58) Field of Classification Search ...................... None
See application file for complete search history.

(56) References Cited

U.S. PATENT DOCUMENTS 5,095,764 A * 3/1992 Saner ....................... 73/862.59
5,986,827 A 11/1999 Hale .......................... 359/819

FOREIGN PATENT DOCUMENTS

JP 2000-357651 12/2000
JP 2002 131605 5/2002

* cited by examiner

*Primary Examiner*—D. Rutledge
(74) *Attorney, Agent, or Firm*—Morgan & Finnegan, LLP

(57) ABSTRACT

The present invention provides a drive mechanism having a high rigidity and capable of performing fine adjustment in 6-axis directions of an optical element such as a mirror or a lens, or a support member for supporting the optical element, in optical equipment such as an exposure device. The drive mechanism has such a feature that three monolithic planar 3-joint or 4-joint link mechanisms are each arranged between a movable portion and a stationary portion through the intermediation of a bearing having at least one degree of freedom of rotation.

25 Claims, 16 Drawing Sheets

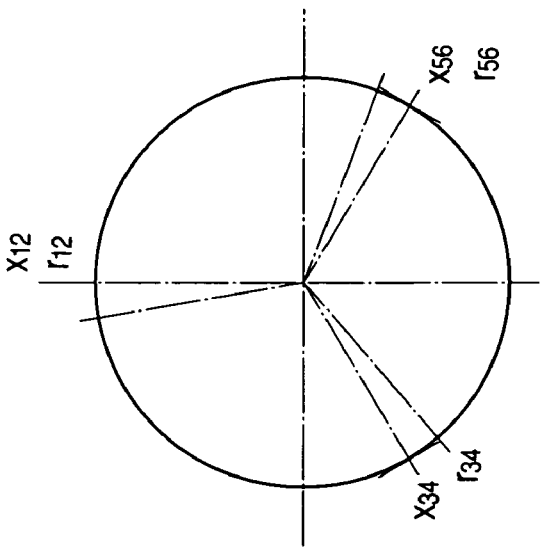
FIG. 5A   FIG. 5B   FIG. 5C
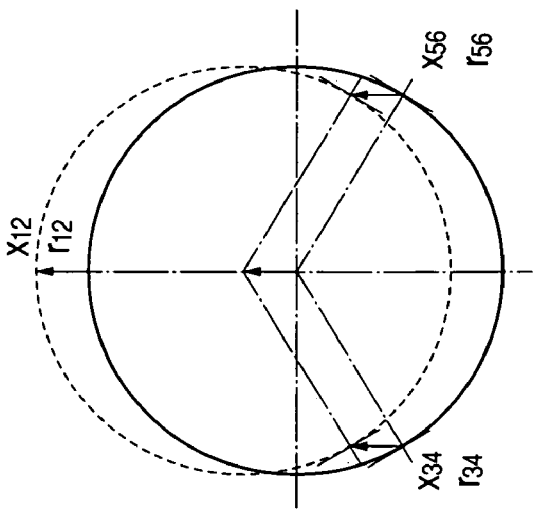
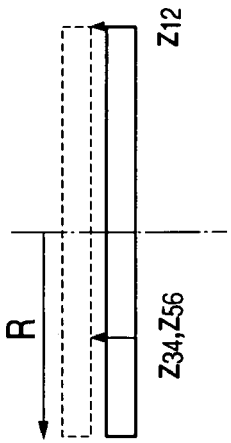
FIG. 5D
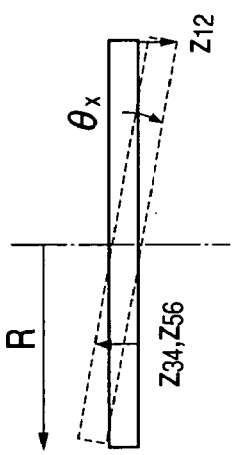
FIG. 5E
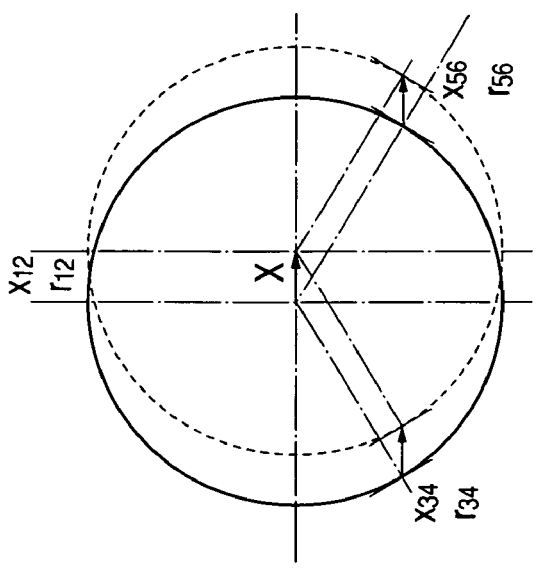
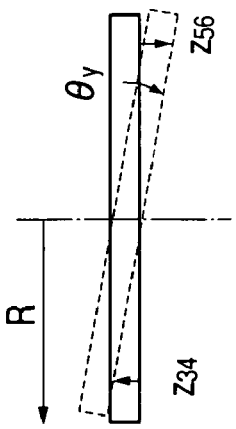
FIG. 5F

DRIVE MECHANISM, EXPOSURE DEVICE, OPTICAL EQUIPMENT, AND DEVICE MANUFACTURING METHOD

BACKGROUND OF THE INVENTION

1. Field of the Invention

The present invention relates to a precision adjustment/drive device, and more specifically to a device for performing fine adjustment on the orientation of an optical element (such as a lens or a mirror) of an exposure device used in the process of manufacturing a semiconductor or a liquid crystal device. In more detail, such orientation adjustment is performed during image formation in which an image on an original (e.g. a mask, a reticle, or the like) is projected to a target object. (e.g. a wafer) through exposure by using the optical element, for effecting the image formation with enhanced accuracy.

It is to be noted that, other than for the optical element adjustment described above, a mechanism described in the present invention can be used for performing 6-axis scanning of a movable portion such as a workpiece of a three-dimensional measurement instrument or a machine tool, a precision moving table, or a specimen mount of a microscope.

2. Related Background Art

A semiconductor exposure device is a device for transferring patterns on an original (reticle) having many different kinds of patterns formed thereon to a silicon wafer (base). For preparation of a high-density circuit, not only resolution performance but also enhanced accuracy of superposition is essential. A superposition error in semiconductor exposure devices is classified into an alignment error, an image distortion, and a magnification error. An alignment error can be mitigated by adjusting relative positions of the original (reticle) and the base (wafer) with respect to each other. On the other hand, an image distortion and a magnification error can be mitigated by moving a part of the optical elements of an optical system. When moving an optical element in the direction of the optical axis, care needs to be taken so that an error in the amount of movement in the movement direction of the optical element, and movement components in directions other than the movement direction, in particular a positional deviation (referred to as "parallel eccentricity") in a direction orthogonal to the optical axis of the optical element and a tilt of the optical element (referred to as "tilt eccentricity"), do not become large.

As a conventional optical element moving device for use in semiconductor exposure devices, there has been devised one as described in Japanese Patent Application Laid-Open No. 2000-357651 which employs a mechanism using a parallel flat spring.

FIGS. 16A and 16B are respectively a sectional view and a top view of the conventional optical element moving device. As shown in the figures, the conventional optical element moving device includes: a movable table 1 for retaining an adjusting lens 7 for adjusting the magnification, abberration, and the like of an optical system, and a cell 8 for supporting the adjusting lens 7; and a stationary table 2 constituting a part of a stationary portion of a projection optical system. A ring-shaped flat spring 11 is fixed to both end faces of the movable table 1 and the stationary table 2 so as to seal both the end faces. The movable table 1 has a cylindrical configuration, and a diameter of its upper surface is different from that of its lower surface. Likewise, the stationary table 2 also has a cylindrical configuration, and an inner diameter of an opening in its upper surface is different from that of an opening in its lower surface. The stationary table 2 has at least one hole, and is thus capable of changing the position of the movable table 1 by changes in the pressure or volume of a drive fluid.

As another conventional example, there is an optical element fine adjustment device as disclosed in U.S. Pat. No. 5,986,827. However, the structure disclosed therein allows fine adjustment in only three axes, and does not allow adjustment within the plane of an optical element, making the device inadequate for applications which require high-precision adjustments on the position and orientation of an optical element.

As still another conventional example, there is one disclosed in Japanese Patent Application Laid-Open No. 2002-131605. However, the device disclosed therein employs a contraction mechanism using a long-arm lever (the distance from the fulcrum to the point of application or the point of action is long), and thus it is expected that the device has a low natural frequency. When the natural frequency is low, vibrations from the exterior of the device are transmitted to a movable portion, which is not only unpreferable for high-precision position and orientation adjustments but also makes it difficult to perform high-speed drive.

With the invention disclosed in Japanese Patent Application Laid-Open No. 2000-357651, parallel eccentricity and tilt eccentricity components, generated in accordance with movement of an optical element, are dependent on the accuracy of guiding by a flat spring guide. In addition, the initial position and the orientation of the optical element are dependent on the assembling accuracy of the device. However, as semiconductor device patterns become increasingly fine, optical elements are increasingly required to realize higher position accuracy, higher orientation accuracy, and higher drive position positioning accuracy for correction of aberrations etc., than conventionally required. For this reason, the devices as disclosed in Japanese Patent Application Laid-Open No. 2000-357651 and U.S. Pat. No. 5,986,827, which perform only one-axis drive and three-axis drive, respectively, are inadequate and a device capable of performing adjustment along three orthogonal axes in a translational direction and also about three axes in the translational direction, thus in 6 axes in total, is being demanded.

Further, in order to mitigate positional displacement of an optical element due to vibrations entering from the exterior of the device, high rigidity is required of the above 6-axis adjustment mechanism at the same time.

In view of the above, an object of the present invention is to provide a drive mechanism or a positioning mechanism which is capable of performing fine adjustment in 6 axis directions and has high rigidity.

SUMMARY OF THE INVENTION

According to one aspect of the invention for accomplishing the foregoing object, a drive mechanism for driving a movable portion with respect to a stationary portion, includes a connecting member that connects the stationary portion and the movable portion to each other, wherein the connecting member has at least one of a monolithic planar 3-joint link mechanism and a monolithic planar 4-joint link mechanism.

According to further aspect of the invention, the drive mechanism includes a deformation member provided at least one of: between the stationary portion and the at least one of the monolithic planar 3-joint link mechanism and the monolithic planar 4-joint link mechanism; and between the movable portion and the at least one of the monolithic planar 3-joint link mechanism and the monolithic planar 4-joint link mechanism, wherein the deformation member is capable of deforming with respect to a first direction and is a rigid body with respect to a second direction orthogonal to the first direction.

According to further aspect of the invention, in the drive mechanism, the deformation member is an elastic member having one degree of freedom and capable of deforming in a rotation direction thereof.

According to further aspect of the invention, in the drive mechanism, the deformation member is capable of deforming with respect to a first direction and is capable of deforming also with respect to a second direction orthogonal to the first direction.

According to further aspect of the invention, in the drive mechanism, the deformation member is an elastic member having two degrees of freedom and capable of deforming in a rotation direction thereof.

According to further aspect of the invention, in the drive mechanism, the monolithic planar 3-joint link mechanism has a first input link, a first connection link, a second connection link, a second input link, a first joint arranged between the first input link and the first connection link, a second joint arranged between the first connection link and the second connection link, and a third joint arranged between the second connection link and the second input link, and wherein the drive mechanism comprises an input element for imparting a displacement to at least one of the first input link and the second input link, and controls deformation of an output portion provided in one of the first connection link and the second connection link by imparting the displacement to the at least one of the first input link and the second input link.

According to further aspect of the invention, in the drive mechanism, a direction of the displacement imparted to the at least one of the first input link and the second input link is parallel to a plane defined by the first joint, the second joint, and the third joint.

According to further aspect of the invention, in the drive mechanism, a direction of the displacement imparted to the at least one of the first input link and the second input link is substantially parallel to a straight line connecting between the first joint and the third joint.

According to further aspect of the invention, in the drive mechanism, the first joint, the second joint, and the third joint each comprise an elastic hinge.

According to further aspect of the invention, in the drive mechanism, the input element has any one of a fluid sealing means, a linear motor, and a feed screw, the fluid sealing means being one of a fluid cylinder, a piezoelectric element, and a bellows.

According to further aspect of the invention, in the drive mechanism, the monolithic planar 4-joint link mechanism has a first input link, a first connection link, an output link, a second connection link, a second input link, a first joint arranged between the first input link and the first connection link, a second joint arranged between the first connection link and the output link, a third joint arranged between the output link and the second connection link, and a fourth joint arranged between the second connection link and the second input link, and wherein the drive mechanism comprises an input element for imparting a displacement to at least one of the first input link and the second input link, and controls displacement of an output portion provided in the output link by imparting the displacement to the at least one of the first input link and the second input link.

According to further aspect of the invention, in the drive mechanism, a direction of the displacement imparted to the at least one of the first input link and the second input link is substantially parallel to a plane defined by the first joint, the second joint, the third joint, and the fourth joint.

According to further aspect of the invention, in the drive mechanism, a direction of the displacement imparted to the at least one of the first input link and the second input link is substantially parallel to a straight line connecting between the first joint and the fourth joint.

According to further aspect of the invention, in the drive mechanism, the first joint, the second joint, the third joint, and the fourth joint each comprise an elastic hinge.

According to further aspect of the invention, in the drive mechanism, at least three connecting members are provided between the stationary portion and the movable portion, and wherein the drive mechanism performs positional control on the movable portion with respect to the stationary portion in 6 axis directions by controlling the at least three the connecting members.

According to further aspect of the invention, the drive mechanism further includes a sensor that measures a relative position of the movable portion with respect to the stationary portion in the 6 axis directions, and wherein the drive mechanism performs the positional control on the movable portion with respect to the stationary portion by using an output value from the sensor.

According to another aspect of the invention, there is provided an exposure device which includes an optical system having at least one optical element for guiding light from a light source to an object to be subjected to exposure and the foregoing drive mechanism, and wherein the at least one optical element is at least one of an optical element supported by the movable portion, an optical element fixed substantially integrally to the movable portion and an optical element that is the movable portion.

According to another aspect of the invention, there is provided a device manufacturing method which includes a step for performing exposure on the object to be subjected to exposure by using the foregoing exposure device, and a step for developing the object that has been subjected to the exposure.

According to another aspect of the invention, there is provided an optical equipment which includes an optical system having at least one optical element for guiding light and the foregoing drive mechanism and wherein the at least one optical element is at least one of an optical element supported by the movable portion, an optical element fixed substantially integrally to the movable portion and an optical element that is the movable portion.

BRIEF DESCRIPTION OF THE DRAWINGS

FIGS. 5A, 5B, 5C, 5D, 5E and 5F show a relationship between the link mechanism and the 6-axis mechanism according to the first embodiment of the present invention;

DESCRIPTION OF THE PREFERRED EMBODIMENTS (First Embodiment)

Figure 1:
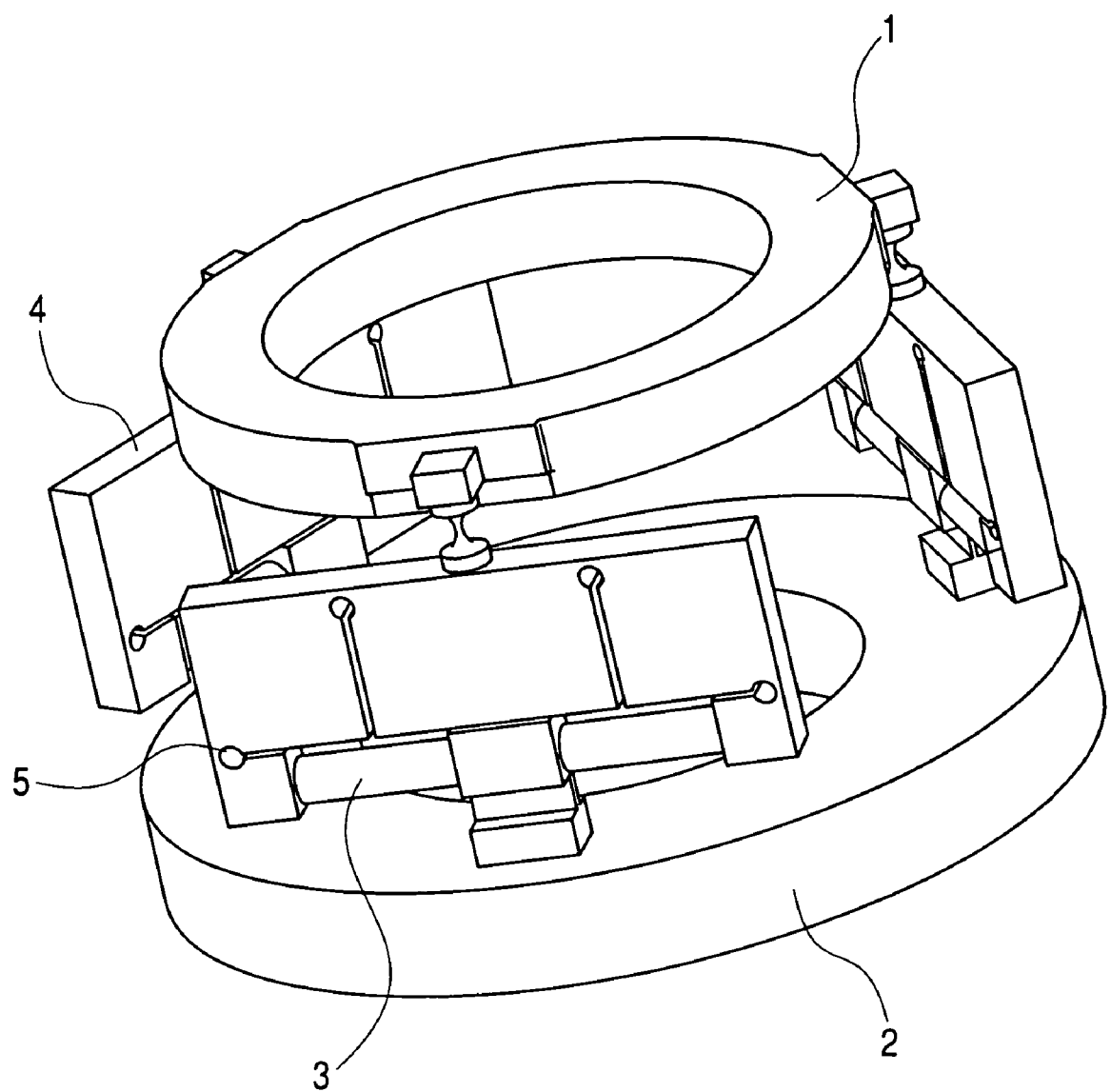
FIG. 1 is a schematic perspective view of a parallel-link 6-axis mechanism using a monolithic planar 4-joint link mechanism according to a first embodiment of the present invention.

FIG. 1 is a schematic perspective view of a drive mechanism (positioning mechanism) according to a first embodiment of the present invention. A movable table 1 has a penetrating hole in FIG. 1, but the movable table 1 may be a member with no such penetrating hole. The movable table 1 may be an optical element such as a mirror or a lens, or may be a retaining member for supporting a lens or a mirror. The optical element used here is desirably one that is used for an illumination optical system or a projection optical system in an exposure device using, for example, EUV light.

As shown in FIG. 1, three monolithic differential link mechanisms 4 are arranged between the movable table 1 and a stationary table 2 substantially circumferentially at regular intervals. The monolithic differential link mechanism 4 used herein is a monolithic planar 4-joint link mechanism. The number of the monolithic planar 4-joint link mechanisms is not necessarily three; more than three monolithic planar 4-joint link mechanisms may be arranged, or if there is another member for restricting the position of the movable member, only one or two such mechanism may be used. The monolithic planar 4-joint link mechanism has such a structure that all the links and the joints (elastic hinges) that are described later are parts of the same member. In other words, all the links and the joints are monolithic into one structure. With respect to both the monolithic planar 3-joint link mechanisms and the monolithic planar 4-joint link mechanisms, it is preferable that all the links and the elastic hinges (joints) are constructed as constituting parts of the same member. However, the links and the elastic hinges may of course be prepared as different members and then combined to construct a monolithic planar 4-joint/3-joint link mechanism.

Figure 3:
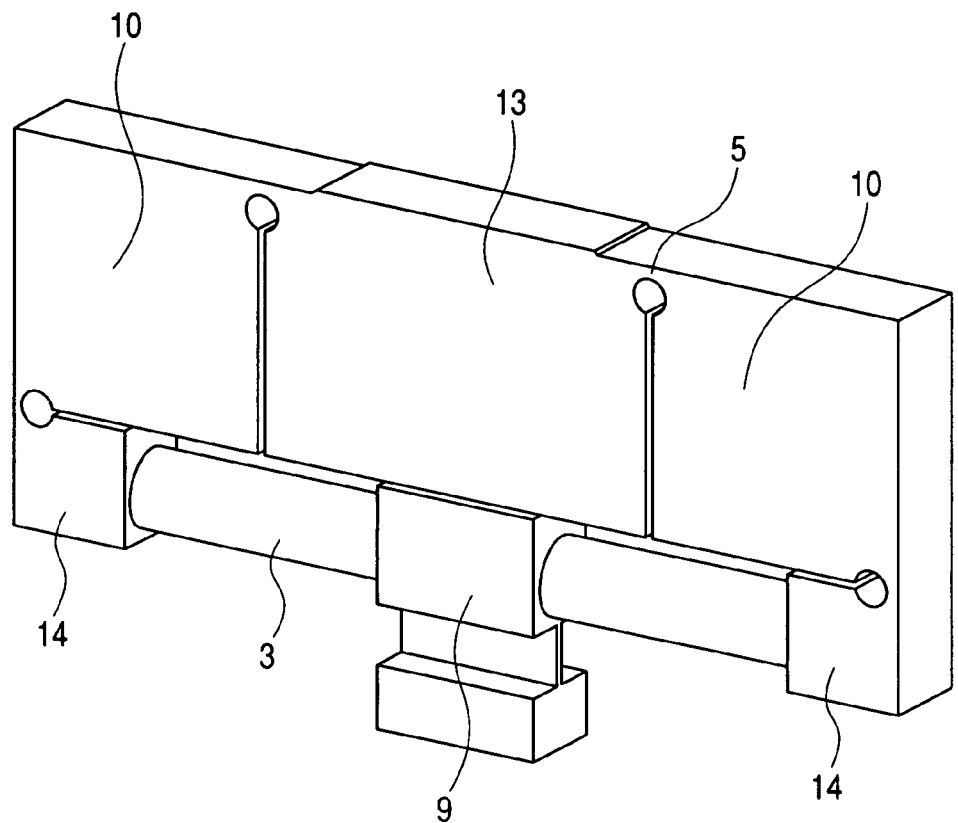
FIG. 3 shows details of the monolithic planar 4-joint link mechanism according to the first embodiment of the present invention.

FIG. 3 shows the monolithic planar 4-joint link mechanism in detail. In the monolithic planar 4-joint link mechanism, five link members are connected in series through four joints within a given plane. The five link members and the four joints are all movable in the given plane. When the monolithic differential link mechanism 4 is applied to the 6-axis fine adjustment mechanism as shown in FIG. 1, the planes constituting the link mechanisms need to be arranged so as to be tangential to the circle passing through the three points where the link mechanisms are mounted to the movable table 1.

Assume that the five link members of the monolithic planar 4-joint link mechanism are a first link, a second link, a third link, a fourth link, and a fifth link in the order of serial connection, and that the joint between the first and second links is a first joint, the joint between the second and third links is a second joint, the joint between the third and fourth links is a third joint, and the joint between the fourth and fifth links is a fourth joint. in this case, one or both of the first and fifth links serve as input links for inputting displacement or force (input links 14 in FIG. 3), and it is the third link (an output link 13 in FIG. 3) that imparts displacement substantially directly to the movable table 1 (object of displacement). The links between the input links and the output link are referred to as connection links 10. In this embodiment, two input links 14, two connection links 10, and one output link 13 are provided, and they are connected in series through elastic hinges 5.

While joints have elasticity in the first embodiment, the joints may not necessarily be endowed with elasticity. Members other than elastic members (elastic hinges, leaf springs, etc.) may be used as long as the five link members are connected in series so as to be movable in a given plane. Members such as hinges, which are not elastic but are only movable in a given plane, may be adopted for the joints.

In this embodiment, of the four joints of the monolithic planar 4-joint link mechanism, the distance between joints (between the first and second joints, between the second and third joints, and between the third and fourth joints) located at both ends of one link is always constant. When different displacements are to be imparted to the movable table (object of displacement), the distances between the joints at both ends of the four joints (between the first and fourth joints) differ as well. In addition, if the distances between the joints at both ends (the first and fourth joints) of the four joints and joints adjacent thereto (the distance between the first and second joints and the distance between the third and fourth joints in this embodiment) are made equal to each other, a structure with good balance and enhanced stability can be provided.

Provided between the monolithic differential link mechanism 4 and the stationary table 2 is an elastic hinge that is rotatable (displaceable) in the radial direction of the movable table (direction perpendicular to the plane of the monolithic differential link mechanism). Provided between the monolithic differential link mechanism 4 and the movable table 1 is an elastic hinge that is rotatable (displaceable) in the tangential direction of the movable table (direction parallel to the plane of the monolithic differential link mechanism and substantially parallel to the movable table.

Figure 2A:
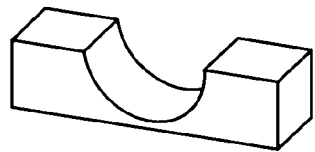
FIGS. 2A, 2B and 2C each show a spring having an arcuate cutout(s).
Figure 2B:
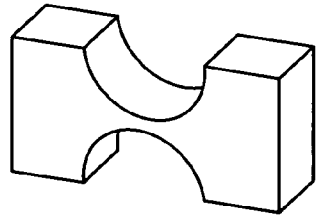
Figure 2C:
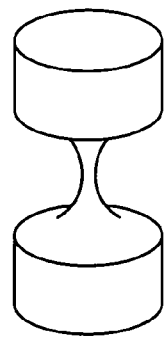

A single elastic hinge that is rotatable in a given direction and which has an arcuate cutout(s) as shown in FIGS. 2A and 2B is used as the elastic hinge between the stationary table 2 and the monolithic differential link mechanism 4. An elastic hinge formed by combining a plurality of elastic hinges that are each movable with respect to a given axis and has the arcuate cutout(s) as shown in FIGS. 2A and 2B may be used as the elastic hinge between the movable table 1 and the monolithic differential link mechanism 4. Alternatively, an elastic hinge that is rotatable with respect to given two axes (i.e. has two degrees of freedom of rotation) and is cut out to have a rotationally symmetrical shape as shown in FIG. 2C may be provided between the movable table 1 and the monolithic differential link mechanism 4. It is of course possible to provide between the movable table 1 and the monolithic differential link mechanism 4 the single elastic hinge that is rotatable in a given direction and which has an arcuate cutout(s) as shown in FIGS. 2A and 2B, and to provide between the stationary table 2 and the monolithic differential link mechanism 4 the elastic hinge formed by combining a plurality of elastic hinges, which are movable with respect to the given axis, or the elastic hinge that is rotatable with respect to the given two axes (i.e. has two degrees of freedom of rotation) and which is cut out to have the rotationally symmetrical shape as shown in FIG. 2C. In addition, any one of the following hinges may be provided between the movable table 1 and the monolithic differential link mechanism 4 and between the stationary table 2 and the monolithic differential link mechanism 4: an elastic hinge that is rotatable in the tangential direction of the movable table (rotatable in the plane where the monolithic differential link mechanism is displaceable), an elastic hinge that is rotatable in the radial direction of the movable table (rotatable in the plane that is perpendicular to both the plane where the monolithic differential link mechanism is displaceable and the plane defined by the three contact points between the movable table and the monolithic differential link mechanisms), and an elastic hinge that is rotatable in both the tangential and radial directions of the movable table (the elastic hinge may be obtained by combining the elastic hinges shown in FIGS. 2A and 2B, or may be the one shown in FIG. 2C).

In the first embodiment, elastic members (elastic hinges, leaf springs, etc.) are provided between the movable table 1 and the monolithic differential link mechanism 4 and between the stationary table 2 and the monolithic differential link mechanism 4. However, members other than elastic members, such as hinges, which are not elastic but are movable only in a given plane, may be used. In addition, an elastic member (hinge) may be provided either between the movable table 1 and the link mechanism, or between the stationary table 2 and the link mechanism. Also, an elastic member may neither be provided between the movable table 1 and the link mechanism nor between the stationary table 2 and the link mechanism. Note, however, that from the viewpoint that the natural frequency of the entire link mechanism is preferably kept high, it is preferable to provide elastic members between the monolithic differential link mechanism 4 and the movable table 1 or between the monolithic differential link mechanism 4 and the stationary table 2.

Figure 4A:
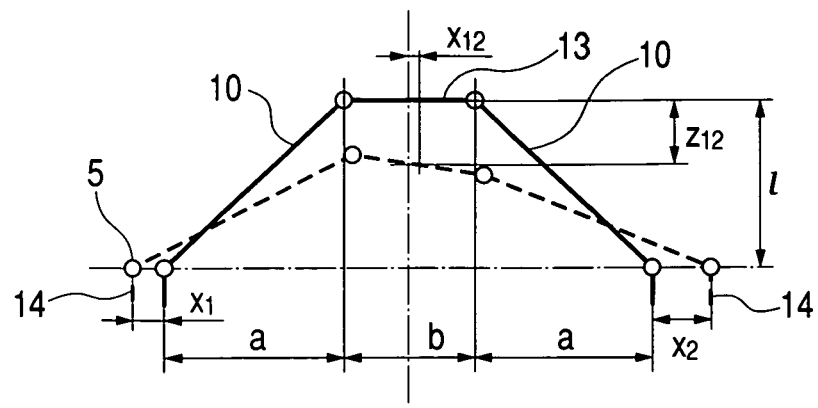
FIGS. 4A, 4B and 4C show a general outline and action of the monolithic planar 4-joint link mechanism according to the first embodiment of the present invention.

FIG. 4A shows the general outline and the basic action of the mechanism. Assume that the displacements imparted by the two input elements 3 are $x_1$ and $x_2$, respectively. The elastic hinges 5 rotate in accordance with the displacements, causing the output link 13 to be displaced by $X_{12}$ along the horizontal direction and by $Z_{12}$ along the vertical direction. The relationship between the displacements imparted by the input elements and the displacement of the output link 13 can be roughly calculated geometrically using the following equations.

$$z_{12} = \frac{1}{2}\frac{a}{l}(x_1 + x_2) \qquad (1)$$

$$x_{12} = \frac{x_2 - x_1}{2}$$

Figure 4B:
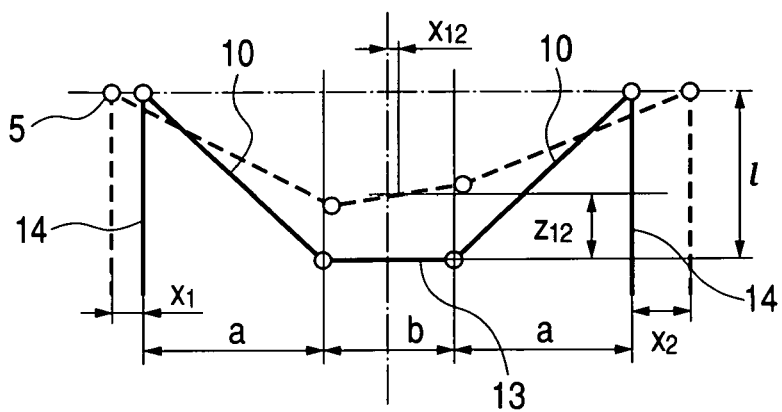

Here, a and l are parameters for determining a geometric shape and are shown in FIG. 4B.

FIGS. 5A to 5F geometrically shows the relationship between the movement of the respective fine adjustment mechanisms and the movement of the stage in the directions of the respective axes. FIG. 5A shows the case where the stage moves by X along the direction of the x-axis, FIG. 5B shows the case where the stage moves by Y along the direction of the y-axis, FIG. 5C shows the case where the stage rotates by $\theta_z$ about the z-axis, FIG. 5D shows the case where the stage rotates by $\theta_y$ about the y-axis, Fig. 5E shows the case where the stage rotates by $\theta_x$ about the x-axis, and FIG. 5F shows the case where the stage moves by Z along the direction of the Z axis. Assume that the amounts of displacement in the tangential directions of the three fine adjustment mechanisms are $x_{12}$, $x_{34}$, and $x_{56}$ (with the counterclockwise direction taken as positive), and the movements toward the center are $r_{12}$, $r_{34}$, and $r_{56}$. If the stage is rigid, the movements of the respective fine adjustment mechanisms can be roughly calculated using the following equations.

$$\begin{pmatrix} x_{12} \\ x_{34} \\ x_{56} \end{pmatrix} = \begin{pmatrix} -1 \\ \frac{1}{2} \\ \frac{1}{2} \end{pmatrix} X + \begin{pmatrix} 0 \\ -\frac{\sqrt{3}}{2} \\ \frac{\sqrt{3}}{2} \end{pmatrix} Y + \begin{pmatrix} R \\ R \\ R \end{pmatrix} \theta_z \qquad (2)$$

$$\begin{pmatrix} r_{12} \\ r_{34} \\ r_{56} \end{pmatrix} = \begin{pmatrix} 0 \\ \frac{\sqrt{3}}{2} \\ \frac{\sqrt{3}}{2} \end{pmatrix} X + \begin{pmatrix} -1 \\ \frac{1}{2} \\ \frac{1}{2} \end{pmatrix} Y \qquad (3)$$

$$\begin{pmatrix} z_{12} \\ z_{34} \\ z_{56} \end{pmatrix} = \begin{pmatrix} 1 \\ 1 \\ 1 \end{pmatrix} Z + \begin{pmatrix} R \\ -\frac{R}{2} \\ -\frac{R}{2} \end{pmatrix} \theta_x + \begin{pmatrix} 0 \\ -\frac{\sqrt{3}}{2}R \\ \frac{\sqrt{3}}{2}R \end{pmatrix} \theta_y \qquad (4)$$

Here, R represents the radius from the center to the fine adjustment mechanism.

By substituting the equation (1) into the equations (2) and (4) followed by rearrangement of $$\begin{pmatrix} x_1 \\ x_2 \\ x_3 \\ x_4 \\ x_5 \\ x_6 \end{pmatrix} = \begin{bmatrix} 1 & 0 & \frac{l}{a} & \frac{l}{a}R & 0 & -R \\ -1 & 0 & \frac{l}{a} & \frac{l}{a}R & 0 & R \\ -\frac{1}{2} & \frac{\sqrt{3}}{2} & \frac{l}{a} & -\frac{l}{a}\frac{R}{2} & -\frac{\sqrt{3}}{2}\frac{l}{a}R & -R \\ \frac{1}{2} & -\frac{\sqrt{3}}{2} & \frac{l}{a} & -\frac{l}{a}\frac{R}{2} & -\frac{\sqrt{3}}{2}\frac{l}{a}R & R \\ -\frac{1}{2} & -\frac{\sqrt{3}}{2} & \frac{l}{a} & -\frac{l}{a}\frac{R}{2} & \frac{\sqrt{3}}{2}\frac{l}{a}R & -R \\ \frac{1}{2} & \frac{\sqrt{3}}{2} & \frac{l}{a} & -\frac{l}{a}\frac{R}{2} & \frac{\sqrt{3}}{2}\frac{l}{a}R & R \end{bmatrix} \begin{pmatrix} X \\ Y \\ Z \\ \theta_x \\ \theta_y \\ \theta_z \end{pmatrix} \quad (5)$$

the equations, the relationship between the displacements of the respective input elements 3 (displacement imparting means) and the displacement of the stage in the directions of six axes can be obtained.

An actuator having a fluid sealed therein, such as piezoelectric element, a bellows, or a cylinder, an electromagnetic actuator such as a linear motor, or a rotary motor may be used as the input element 3 through the intermediation of a direct action converting mechanism. A feed screw may also be used with a piezoelectric element serving as a source of input.

It is desirable that the orientation of the stage be measured in the directions of six axes in which the stage is driven. A laser interferometer, an eddy current sensor, a capacitance displacement gauge, a linear encoder, or a differential transformer transducer may be used for the measurement depending on the precision required.

Figure 6:
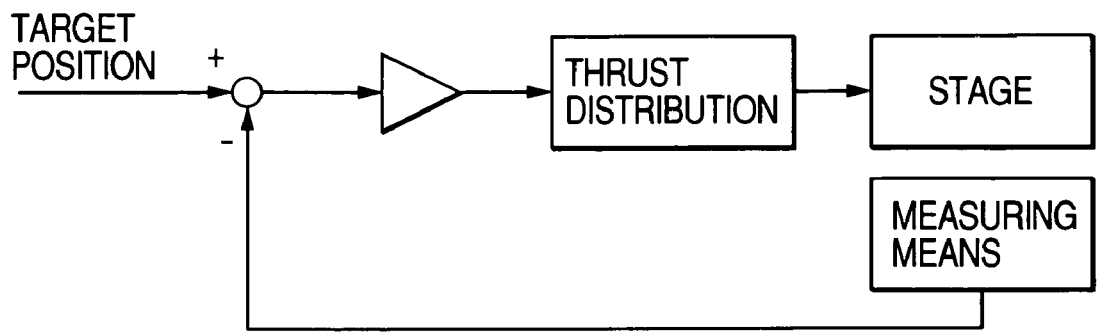
FIG. 6 shows a position control system for the 6-axis mechanism according to the first embodiment of the present invention.

It is desirable to develop a servo control system as shown in FIG. 6 for precision drive of the stage. In this embodiment, position control is performed by using the results of the stage orientation measurement with the measurement means described above. Note that in this embodiment, the command value to each of the input elements 3 should be issued by using thrust distribution based on the equation (5).

Figure 4C:
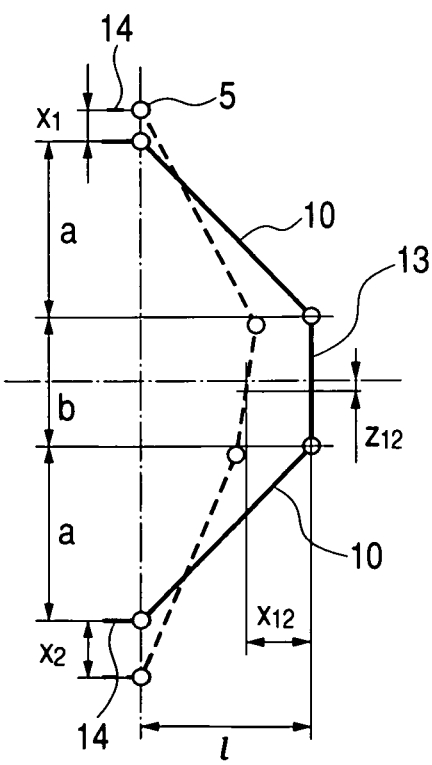

The monolithic planar 4-joint link mechanism of this embodiment, which is shown in FIG. 3, can be modified as shown in FIGS. 4B and 4C (only the general outline and the basic action are shown here). FIG. 4B shows a case where the arrangement of the links is turned around. FIG. 4C shows an arrangement where the arrangement shown in FIG. 4A is rotated by 90 degrees, and reducing the force (weight of the movable portion) applied to the input elements 3 in the shear direction. In these cases, it is necessary to consider the relationship between the input displacement and the output displacement represented by the equation (1) with the interchanging of the character variables in mind. Apart from the above arrangements, it is possible to realize an arrangement that appears symmetrical to the arrangement of FIG. 4C in the lateral direction in the drawing (just as the relationship between the FIGS. 4A and 4B) as a modification, which is not shown.

The displacement (or force) imparted to the input links may be displacement (or force) in any directions within the plane where the monolithic planar 4-joint link mechanism is displaceable. Specific examples of the displacement are described later in a third embodiment of the present invention.

Further, in order to support the movable table 1 with respect to the stationary table 2, that is, to compensate for the own weight of the movable table 1, an elastic member (bellows, spring, etc.), magnets arranged so as to repel each other, or magnets arranged so as to attract each other may be provided between the movable table and the stationary table.

(Second Embodiment)

Figure 7:
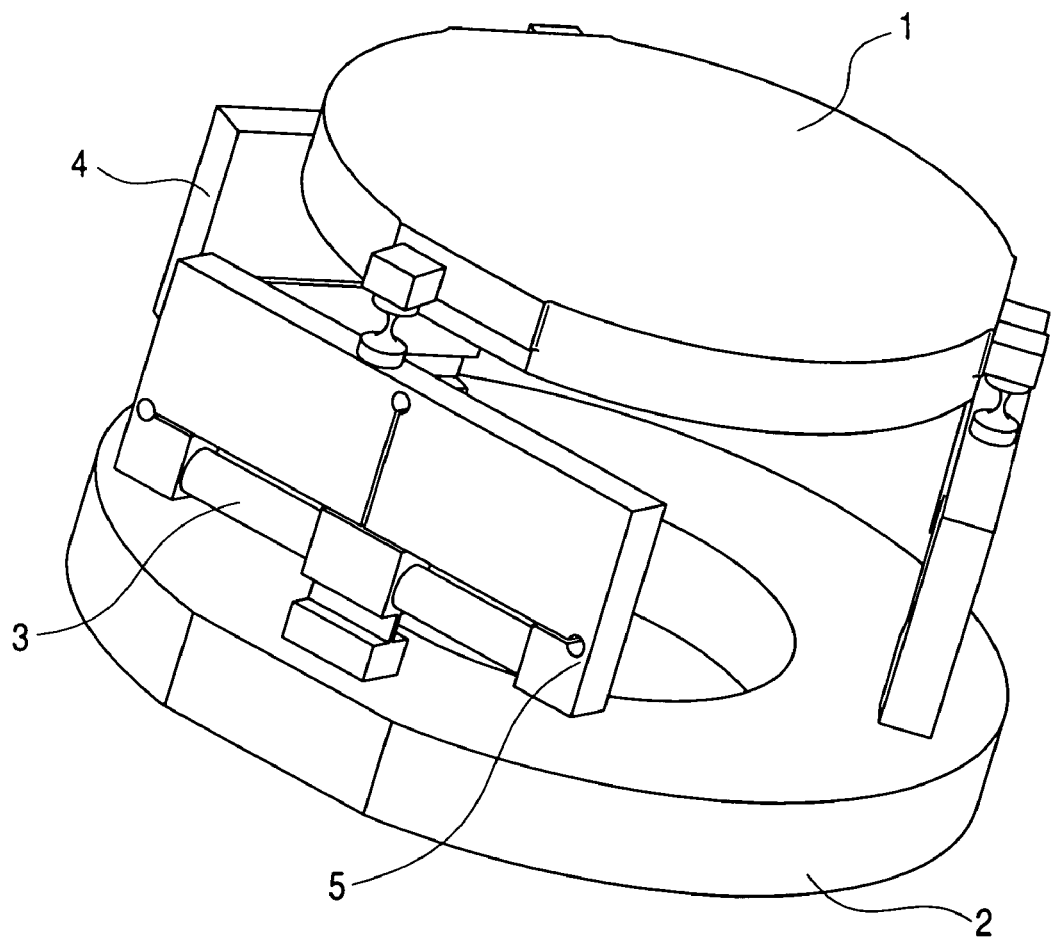
FIG. 7 is a schematic perspective view of a parallel-link 6-axis mechanism using a monolithic planar 3-joint link mechanism according to a second embodiment of the present invention.

FIG. 7 is a schematic perspective view of a second embodiment of the present invention. The same reference numerals are used for members corresponding to those in the first embodiment. The movable table 1 is an optical element such as a mirror or a lens, or a retaining member for supporting a lens or a mirror.

Three monolithic differential -link mechanisms 4 are arranged between the movable table 1 and a stationary table 2 substantially circumferentially at regular intervals. Provided between the monolithic differential link mechanism 4 and the movable table 1, and between the monolithic differential link mechanism 4 and the stationary table 2, are one or both of an elastic hinge that is rotatable in the radial direction (direction perpendicular to the plane where the monolithic differential link mechanism is displaceable) and an elastic hinge that is rotatable in the tangential direction.

One or a combination of the elastic hinges shown in FIGS. 2A and 2B which have the arcuate cutout(s) may be used as the elastic hinges between the monolithic differential link mechanism 4 and the movable table 1 and between the monolithic differential link mechanism 4 and the stationary table 2. A hinge obtained by combining the above elastic hinges shown in FIGS. 2A and 2B, or the elastic hinge that are cut out to have the rotationally symmetrical shape as shown in FIG. 2C may be used. Other alternative hinges are the same as those in the first embodiment.

Figure 8:
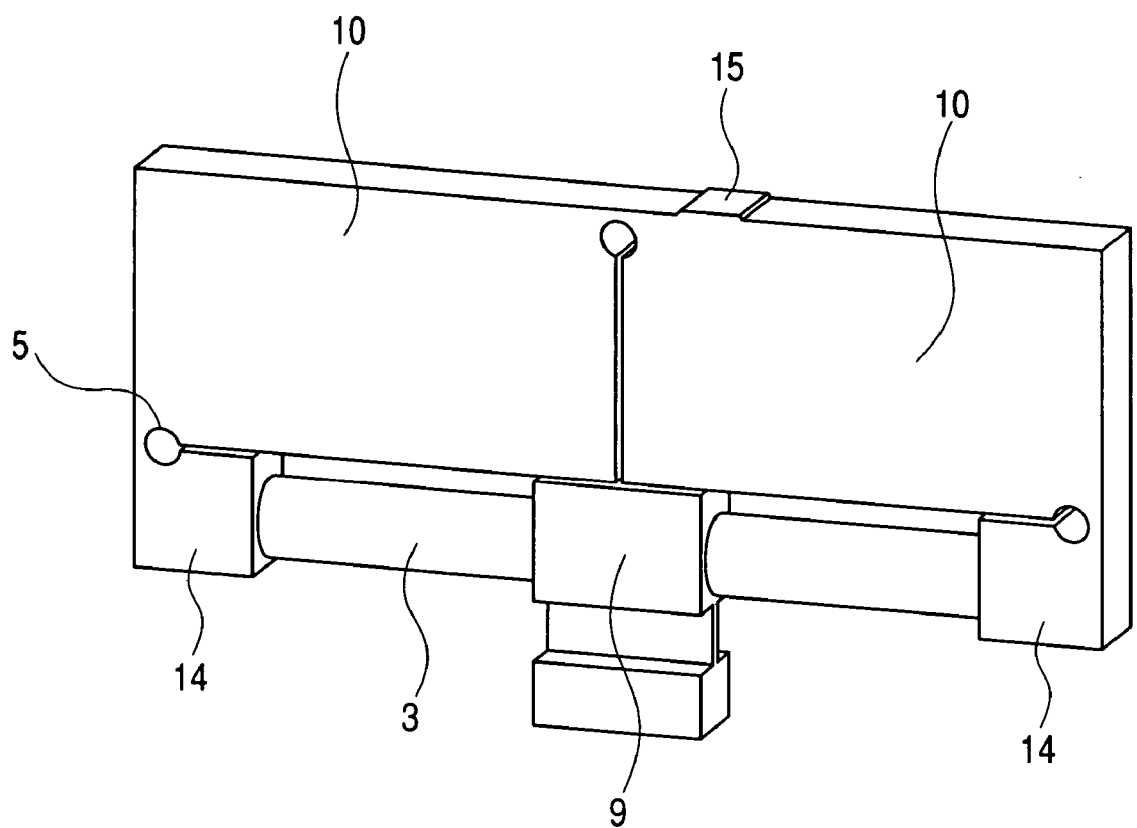
FIG. 8 shows details of the monolithic planar 3-joint link mechanism according to the second embodiment of the present invention.

The second embodiment differs from the first embodiment in that a monolithic planar 3-joint link mechanism as shown in FIG. 8 is used as the monolithic differential link mechanism. FIG. 8 shows the monolithic planar 3-joint link mechanism in detail. As shown in FIG. 8, four link members are connected in series through three joints in the link mechanism.

Assume that the four link members of the monolithic planar 3-joint link mechanism are a first link, a second link, a third link, and a fourth link in the order of serial connection, and that the joint between the first and second links is a first joint, the joint between the second and third links is a second joint, and the joint between the third and fourth links is a third joint. In this case, one or both of the first and fourth links serve as input links for inputting displacement or force (input links 14 in FIG. 8), and the second or third links (connection links 10 in FIG. 8) serves to impart displacement substantially directly to the movable table 1 (object of displacement). In this embodiment, two input links 14 and two connection links 10 are provided, and they are connected in series through elastic hinges 5.

While the joints have elasticity in the second embodiment as well as in the first embodiment, the joints may not necessarily be endowed with elasticity. Members other than elastic members (elastic hinges, leaf springs, etc.) may be used as long as the four link members are connected in series so as to be movable in a given plane. Members such as hinges, which are not elastic but are only movable in a given plane, may be adopted for the joints.

Further, an elastic member (hinge) may only be provided between the movable table 1 and the link mechanism, or between the stationary table 2 and the link mechanism. Also, an elastic member may neither be provided between the movable table 1 and the link mechanism nor between the stationary table 2 and the link mechanism. Note, however, that from the viewpoint that the natural frequency of the entire link mechanism is preferably kept high, it is preferable to provide elastic members between monolithic differential link mechanism 4 and the movable table 1 and between the monolithic differential link mechanism 4 and the stationary table 2.

In the second embodiment of the three joints of the monolithic planar 3-joint link mechanism, the distance between joints (between the first and second joints, and between the second and third joints). located at both ends of one link is always constant. When different displacements are to be imparted to the movable table (object of displacement), the distances between the joints at both ends of the three joints (between the first and third joints) differ as well. In addition, if the distances between the joints at both ends (the first and third joints) of the four joints and joints adjacent thereto (the distance between the first and second joints and the distance between the second and third joints in this embodiment) are made equal to each other, a structure with good balance and enhanced stability can be provided.

When the monolithic planar 3-joint link mechanism 4 is to be applied to the 6-axis fine adjustment mechanism as shown in FIG. 7, the planes constituting the link mechanisms need to be arranged so as to be tangential to the circle passing through the three points where the link mechanisms are mounted to the movable table 1.

In the link mechanism of this embodiment, it is desirable that an output portion 15 of the link mechanism be located close to the elastic hinge between the connection links 10. With such a construction, the displacement of the output portion with respect to the displacement (or force) imparted to the input links is larger than that in the case where the output portion 15 is located away from the elastic hinge between the connection links 10. The distance from the joint between the connection links (the second joint) to (the center of) the output portion is preferably less than half, and more preferably less than one-fourth, the distance between the second joint and the adjacent joints (the first and third joints). Note, however, that the output portion needs to be so far away from the elastic hinge at the second joint as not to affect the movement of the elastic hinge. Therefore, the distance from the joint between the connection links (the second joint) to (the center of) the output portion is preferably more than one-tenth the distance between the second joint and the adjacent joints (the first and third joints), or is more than twice the width of the member to be mounted to the output portion (the member used to connect the link mechanism to the movable table).

It is desirable that each link mechanism be connected to the movable table through the elastic hinge that is connected to the output portion.

Figure 9A:
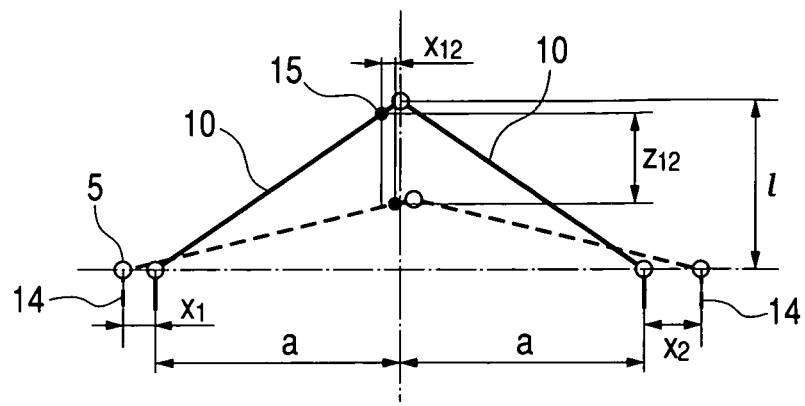
FIGS. 9A, 9B and 9C show a general outline and action of the monolithic planar 3-joint link mechanism according to the second embodiment of the present invention.

FIG. 9A shows the general outline and the basic action of the mechanism. Assume that the displacements imparted by the two input elements 3 are $x_1$ and $x_2$, respectively. The elastic hinges 5 rotate in accordance with the displacements, causing the output portion 15 to be displaced by $X_{12}$ along the horizontal direction and by $Z_{12}$ along the vertical direction. The relationship between the displacements of the input elements and the displacement of the output portion 15 can be roughly calculated geometrically using the equations (1).

The relationship between the displacement of the stage and the displacements of the respective input elements 3 can be calculated as in the first embodiment, using the equation (5) in this embodiment.

An actuator having a fluid sealed therein, such as a piezoelectric element, a bellows, or a cylinder, an electromagnetic actuator such as a linear motor, or a rotary motor may be used as the input element 3 through the intermediation of a direct action converting mechanism. A feed screw may also be used with a piezoelectric element serving as a source of input.

It is desirable that the orientation of the stage be measured in the directions of six axes in which the stage is driven. A laser interferometer, an eddy current sensor, a capacitance displacement gauge, a linear encoder, or a differential transformer transducer may be used for the measurement depending on the precision required.

It is desirable to develop a servo control system as shown in FIG. 6 for precision drive of the stage. In this embodiment, position control is performed by using the results of the stage orientation measurement with the measuring means described above. Note that in this embodiment, the command value to each of the input elements 3 is desirably issued by using thrust distribution based on the equation (5).

Figure 9B:
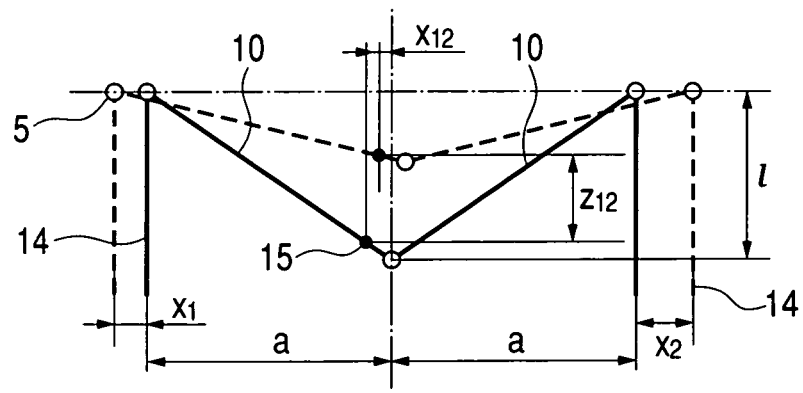
Figure 9C:
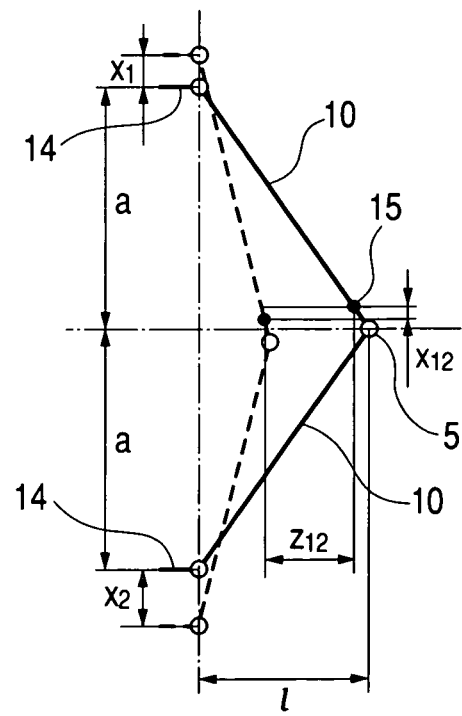

The monolithic planar 3-joint link mechanism of this embodiment, which is shown in FIG. 8, can be modified as shown in FIGS. 9B and 9C (only the general outline and the basic action are shown here). FIG. 9B shows an arrangement where the arrangement of the links is turned around. FIG. 9C shows an arrangement where the arrangement shown in FIG. 9A is rotated by 90 degrees, reducing the force (weight of the movable portion) applied to the input elements 3 in the shear direction. In these cases, it is necessary to consider the relationship between the input displacement and the output displacement represented by the equation (1), with the interchanging of the character variables in mind. Apart from the above arrangements, it is possible to realize an arrangement that appears symmetrical to the arrangement of FIG. 9C in the lateral direction in the drawing (just as the relationship between the FIGS. 9A and 9B) as a modification, which is not shown.

The displacement (or force) imparted to the input links may be displacement (or force) in any directions within the plane where the monolithic planar 3-joint link mechanism is displaceable. Specific examples of the displacement are described later in a fourth embodiment of the present invention.

(Third Embodiment)

Figure 10:
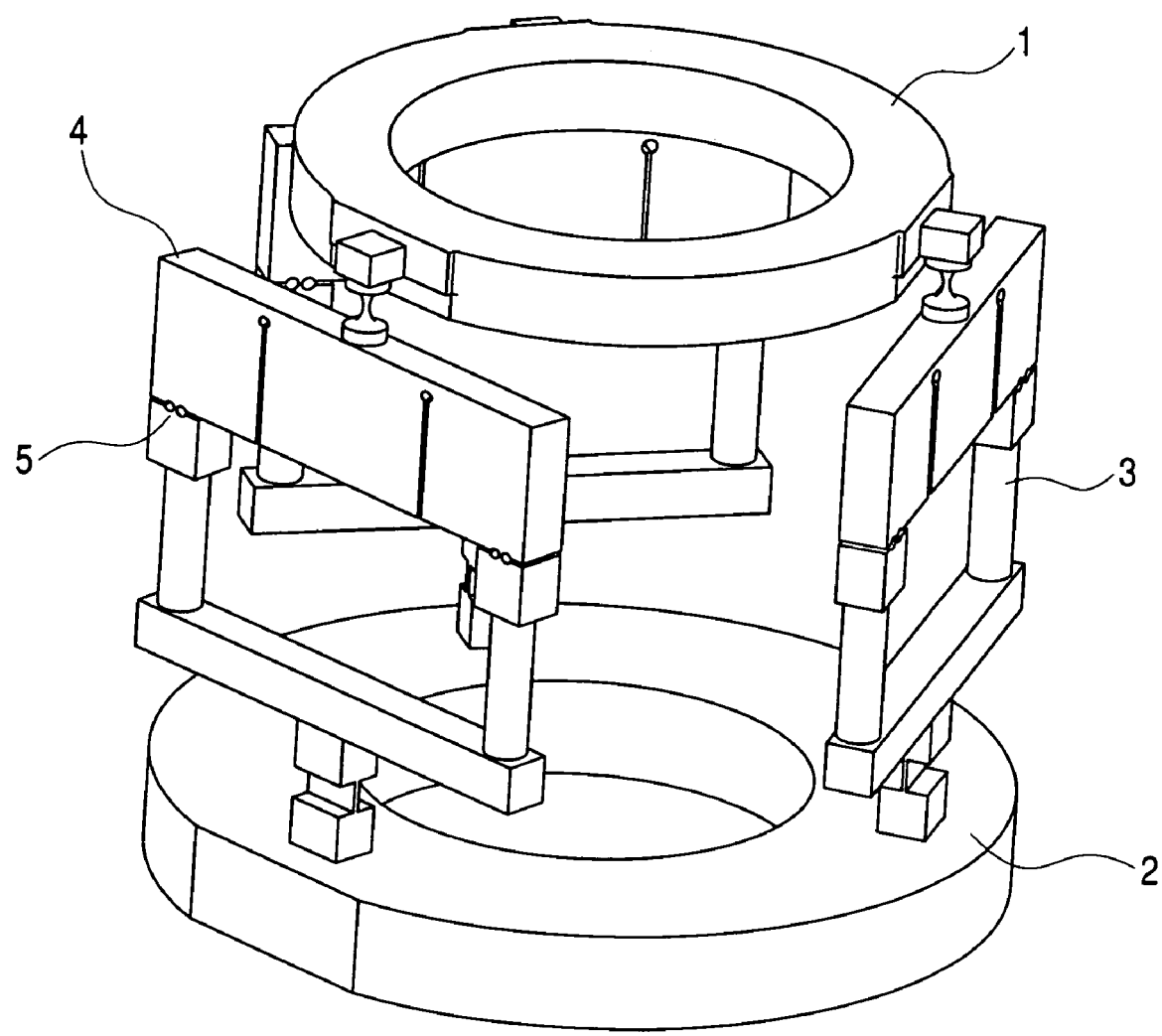
FIG. 10 is a schematic perspective view of a parallel-link 6-axis mechanism using a monolithic planar 4-joint link mechanism according to a third embodiment of the present invention.

FIG. 10 is a schematic perspective view of a third embodiment of the present invention. The structures similar to the first embodiment are not described below.

In this embodiment, three monolithic differential link mechanisms 4 are arranged between the movable table 1 and a stationary table 2 substantially circumferentially at regular intervals. In this embodiment, the monolithic differential link mechanism 4 is a monolithic planar 4-joint link mechanism.

The third embodiment differs from the first embodiment in that the directions of the displacement or force imparted to the input links are different from those of the first embodiment, as shown in FIGS. 10, 11, 12A and 12B.

In the first embodiment, the displacement (or force) in the direction which is parallel to the plane where the monolithic planar 4-joint link mechanism is displaceable and is substantially parallel to the movable table 1 is imparted to one or both of the input links (the first and fifth links) located at both ends of the five link members. However, in the third embodiment, the displacement (or force) in the direction which is parallel to the plane where the monolithic planar 4-joint link mechanism is displaceable and which is substantially perpendicular to the plane defined by the three connecting points between the movable table and the monolithic differential link mechanisms is imparted to one or both of the input links. In other words, the direction of the displacement (or force) imparted to the input links is different from that in the first embodiment.

Figure 12A:
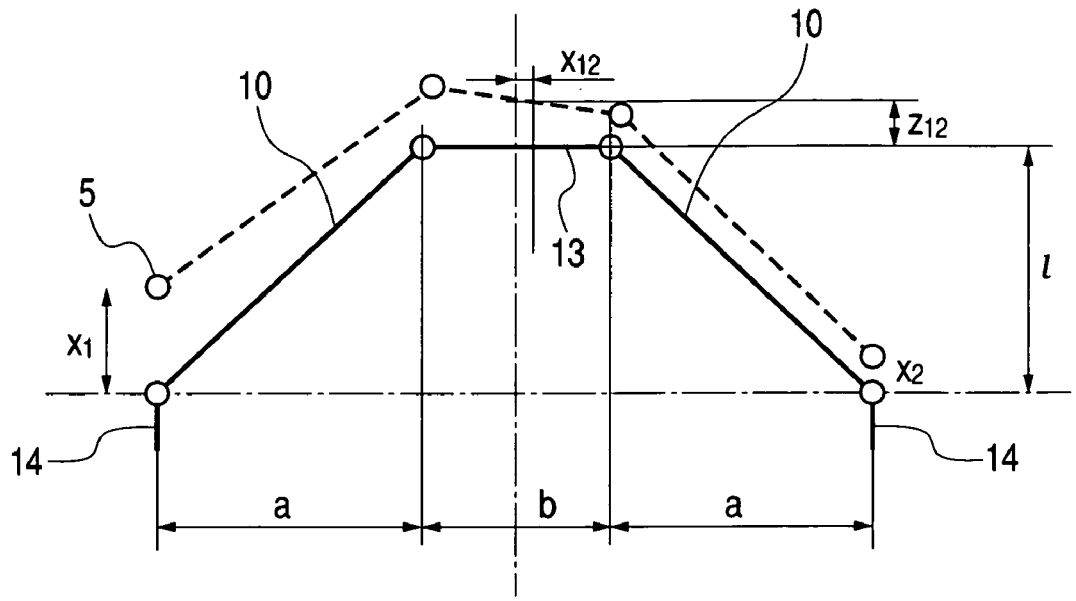
FIGS. 12A and 12B show a general outline and action of the monolithic planar 4-joint link mechanism according to the third embodiment of the present invention.

FIG. 12A shows the general outline of the mechanism. Assume that the displacements imparted by the two input elements 3 are $x_1$ and $x_2$, respectively. The elastic hinges 5 rotate in accordance with the displacements, causing the output link 13 to be displaced by $X_{12}$ along the horizontal direction and by $Z_{12}$ along the vertical direction. The relationship between the displacements imparted by the input elements and the displacement of the output link 13 can be roughly calculated geometrically using the following equations.

$$z_{12} = \frac{x_2 - x_1}{2} \quad (6)$$
$$x_{12} = \frac{1}{2}\frac{l}{a}(x_1 + x_2)$$

Here, a and l are parameters for determining a geometric shape and are as shown in FIG. 12A.

The relationship between the displacements of the respective input elements 3 and the 6-axis directions of the stage can be calculated as in the embodiment 1 using the equations (6).

An actuator having a fluid sealed there in, such as a piezoelectric element, a bellows, or a cylinder, an electromagnetic actuator such as a linear motor, or a rotary motor may be used as the input element 3 through the intermediation of a direct action converting mechanism. A feed screw may also be used with a piezoelectric element serving as a source of input.

It is desirable that the orientation of the stage be measured in the directions of six axes in which the stage is driven. A laser interferometer, an eddy current sensor, a capacitance displacement gauge, a linear encoder, or a differential transformer transducer may be used for the measurement depending on the precision required.

It is desirable to develop a servo control system as shown in FIG. 6 for precision drive of the stage. In this embodiment, position control is performed by using the results of the stage orientation measurement with the measuring means described above. Note that in this embodiment, the command value to each of the input elements 3 is desirably issued through calculation based on thrust distribution.

Figure 11:
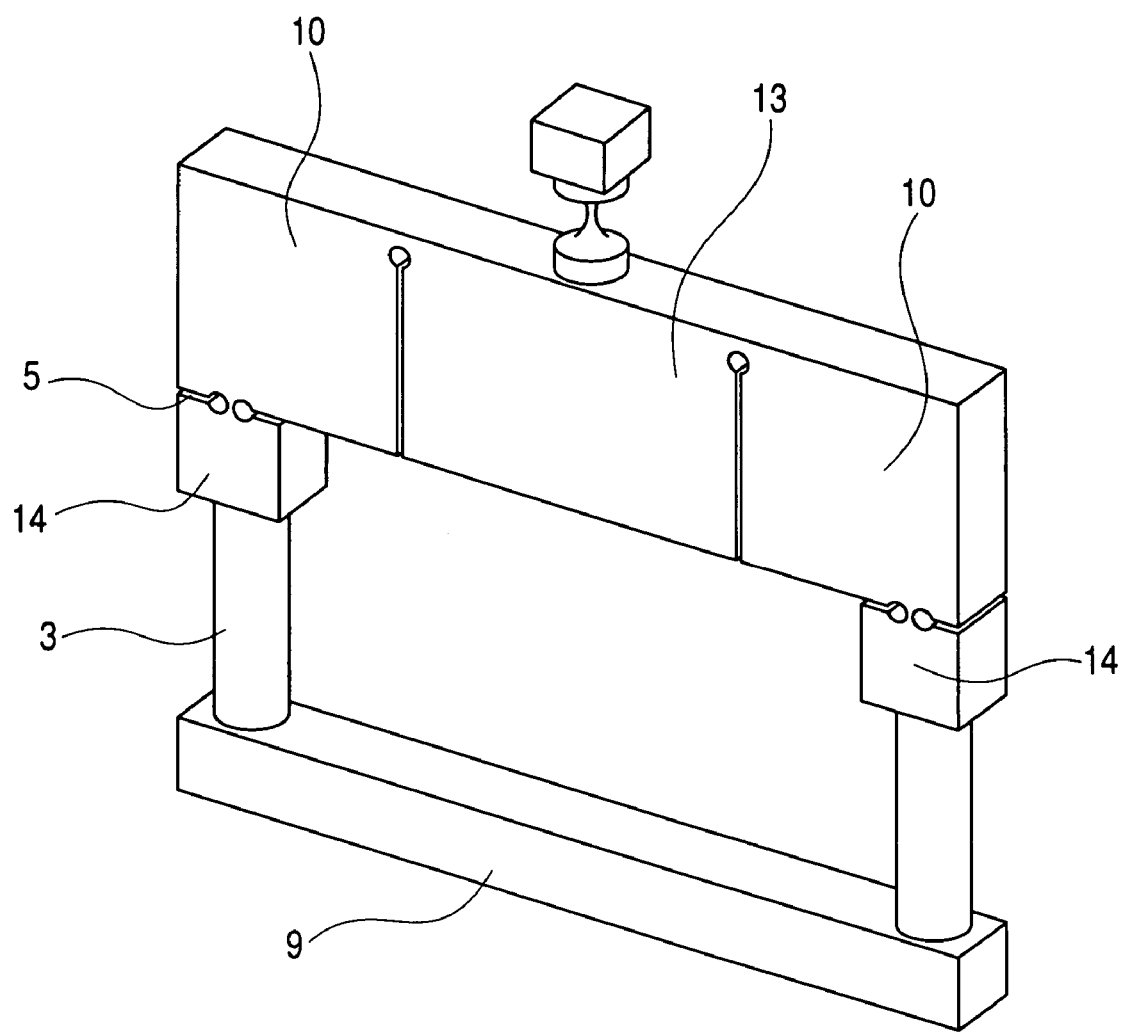
FIG. 11 shows details of the monolithic planar 4-joint link mechanism according to the third embodiment of the present invention.
Figure 12B:
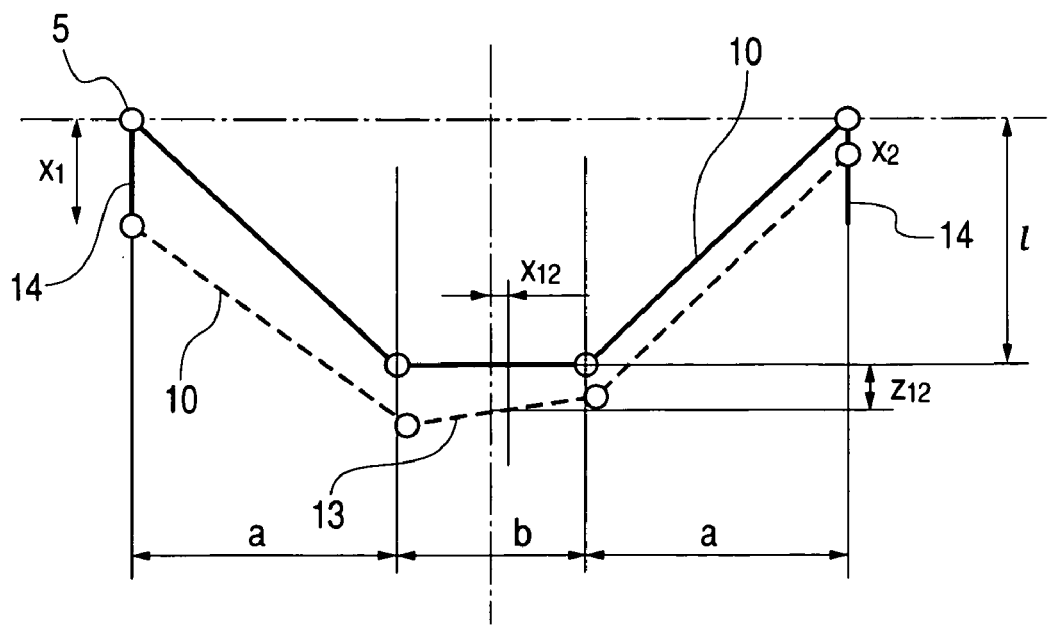

The monolithic planar 3-joint link mechanism of this embodiment, which is shown in FIG. 11, can be modified as shown in FIG. 12B (only the general outline and the basic action are shown here). FIG. 12B shows an arrangement where the arrangement of the links in FIG. 12A is turned around. Accordingly, the mechanism and the input elements 3 can be arranged in a smaller space. Apart from the above arrangements, it is possible to realize as modifications an arrangement where the arrangement shown in FIG. 12A is rotated by 90 degrees, and an arrangement where the above arrangement is further turned around, which are not shown.

(Fourth Embodiment)

Figure 13:
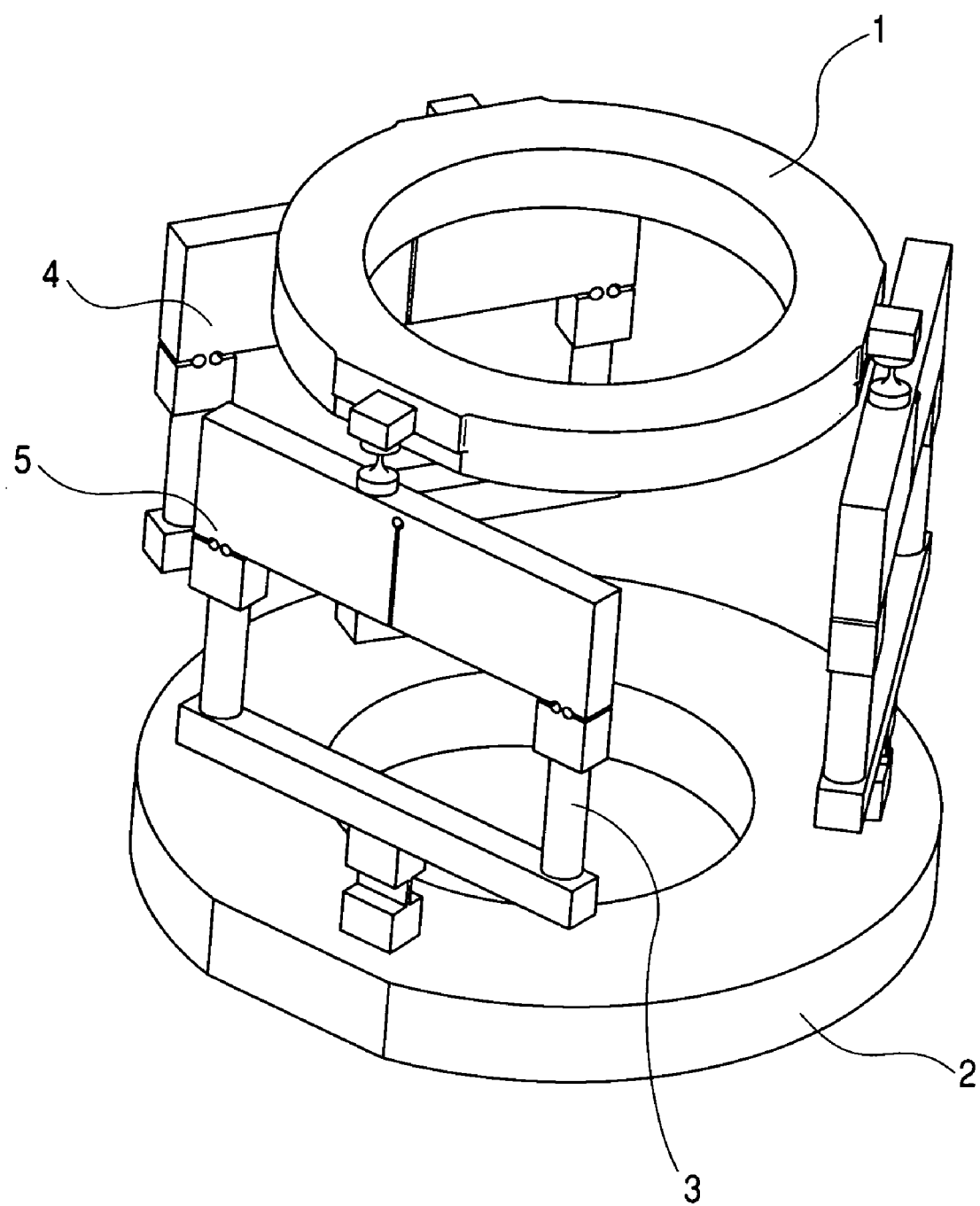
FIG. 13 is a schematic perspective view of a parallel-link 6-axis mechanism using a monolithic planar 3-joint link mechanism according to a fourth embodiment of the present invention.

FIG. 13 is a schematic perspective of a fourth embodiment of the present invention. The structures similar to the second embodiment are not described below.

Three monolithic differential link mechanisms 4 are arranged between the movable table 1 and a stationary table 2 substantially circumferentially at regular intervals. The monolithic differential link mechanism 4 in this embodiment is a monolithic planar 3-joint link mechanism.

The fourth embodiment differs from the second embodiment in that the directions of the displacement or force imparted to the input links are different from those of the second embodiment, as shown in FIGS. 13, 14, 15A and 15B.

In the second embodiment, the displacement (or force) in the direction which is parallel to the plane where the monolithic planar 3-joint link mechanism is displaceable and is substantially parallel to the movable table 1 is imparted to one or both of the input links (the first and fourth links) located at both ends of the four link members. However, in the fourth embodiment, the displacement (or force) in the direction which is parallel to the plane where the monolithic planar 4-joint link mechanism is displaceable and is substantially perpendicular to the plane defined by the three connecting points between the movable table 1 and the link mechanisms is imparted to one or both of the input links. In other words, the direction of the displacement (or force) imparted to the input links is different from that in the second embodiment.

Figure 14:
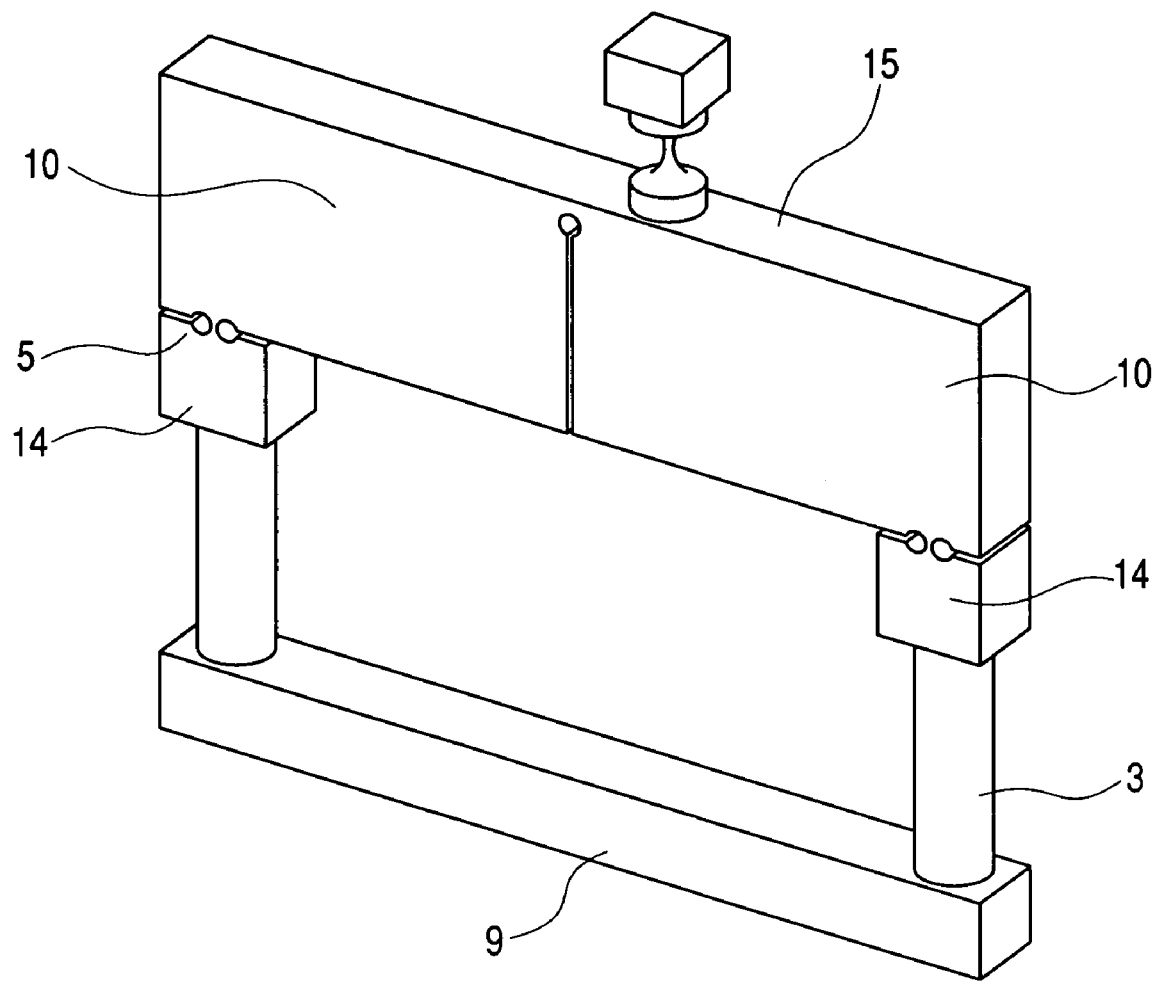
FIG. 14 shows details of the monolithic planar 3-joint link mechanism according to the fourth embodiment of the present invention.

FIG. 14 shows the monolithic planar 3-joint link mechanism in detail. When the monolithic differential link mechanism 4 is to be applied to the 6-axis fine adjustment mechanism as shown in FIG. 13, the planes constituting the link mechanisms need to be arranged so as to be tangential to the circle passing through the three points where the link mechanisms are mounted to the movable table 1.

In the link mechanism of this embodiment, it is desirable that the output portion 15 of the link mechanism be located close to the elastic hinge between the connection links 10. With such a construction, the displacement of the output portion with respect to the displacement (or force) inputted to the input links is larger than that in the case where the output portion 15 is located away from the elastic hinge between the connection links 10. The distance from the joint between the connection links (the second joint) to (the center of) the output portion is preferably less than half, and more preferably less than a quarter, of the distance between the second joint and the adjacent joints (the first and third joints). Note, however, that the output portion needs to be spaced apart from the elastic hinge at the second joint so as not to affect the movement of the elastic hinge. Therefore, the distance from the joint (the second joint) between the connection links to (the center of) the output portion is preferably larger than one-tenth the distance between the second joint and the adjacent joints (the first and third joints), or is larger than twice the width of the member to be mounted to the output portion (the member used to connect the link mechanism to the movable table).

It is desirable that each link mechanism be connected to the movable table through the elastic hinge that is connected to the output portion.

Figure 15A:
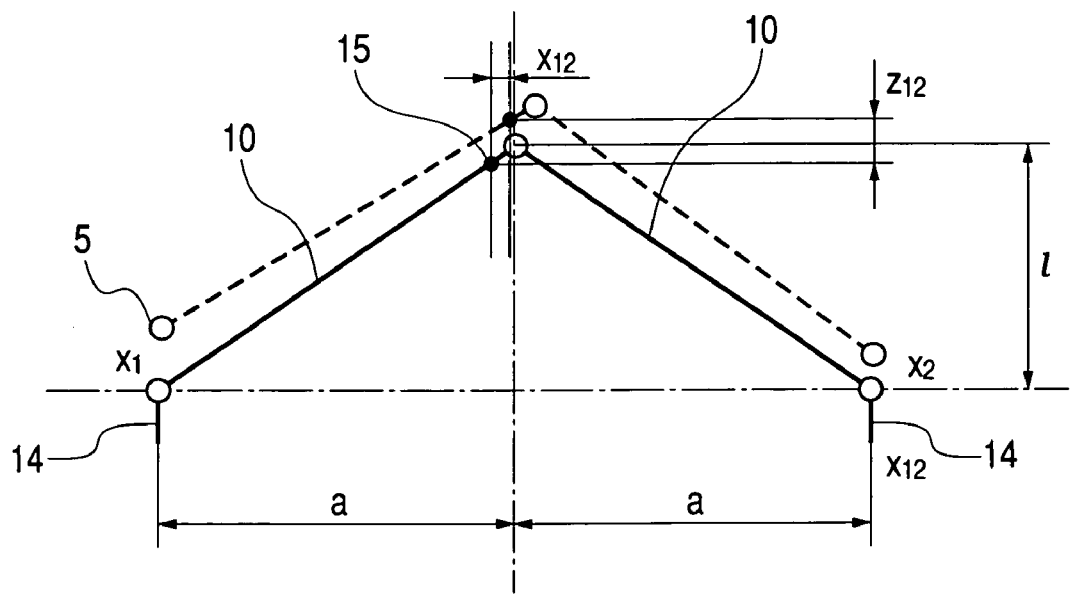
FIGS. 15A and 15B show a general outline and action of the monolithic planar 3-joint link mechanism according to the fourth embodiment of the present invention.

FIG. 15A shows the general outline of the mechanism. Assume that the displacements imparted by the two input elements 3 are $x_1$ and $x_2$, respectively. The elastic hinges 5 rotate in accordance with the displacements, causing the output portion 15 to be displaced by $X_{12}$ along the horizontal direction and by $Z_{12}$ along the vertical direction. The relationship between the displacements imparted by the input elements and the displacement of the output portion 15 can be roughly calculated geometrically using the equations (6). Here, a and l are parameters for determining a geometric shape and are as shown in FIG. 9A.

The relationship between the displacements of the respective input elements 3 and the 6-axis directions of the stage can be calculated as in the embodiment 1 using the equations (6).

An actuator having a fluid sealed therein, such as a piezoelectric element, a bellows, or a cylinder, an electromagnetic actuator such as a linear motor, or a rotary motor may be used as the input element 3 through the intermediation of a direct action converting mechanism. A feed screw may also be used with a piezoelectric element serving as a source of input.

It is desirable that the orientation of the stage be measured in the directions of six axes in which the stage is driven. A laser interferometer, an eddy current sensor, a capacitance displacement gauge, a linear encoder, or a differential transformer transducer may be used for the measurement depending on the precision required.

It is desirable to develop a servo control system as shown in FIG. 6 for precision drive of the stage. In this embodiment, position control is performed by using the results of the stage orientation measurement with the measuring means described above. Note that in this embodiment, the command value to each of the input elements 3 is desirably issued through calculation based on thrust distribution.

Figure 15B:
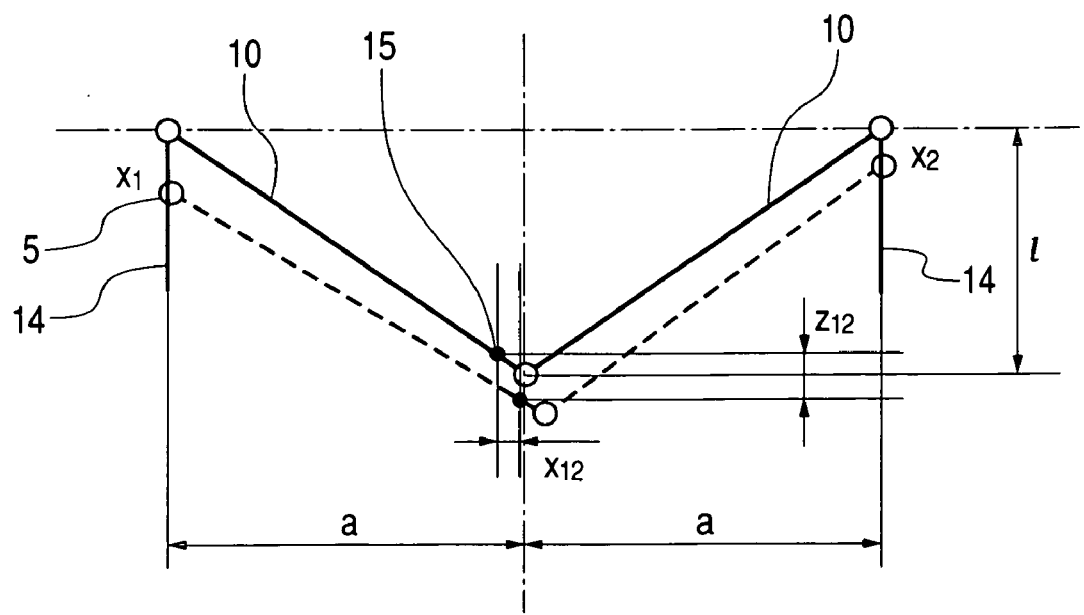
Figure 16A:
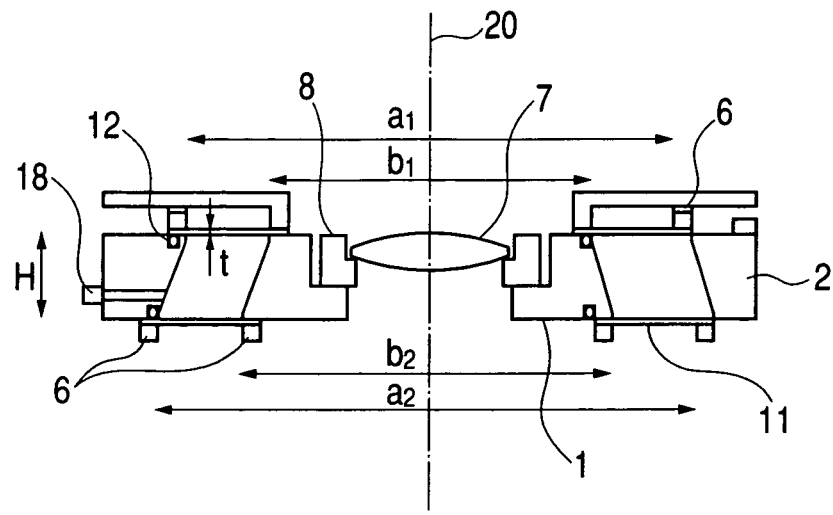
FIG. 16A and 16B are views for explaining a flat spring type optical element fine adjustment mechanism of the prior art.
Figure 16B:
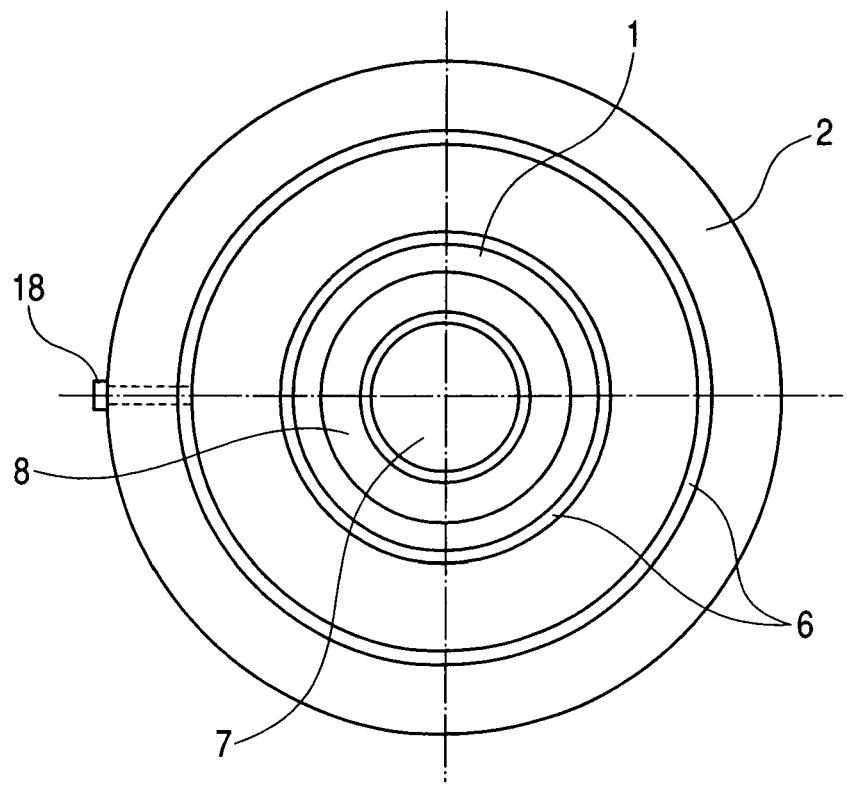

The monolithic planar 3-joint link mechanism of this embodiment, which is shown in FIG. 14, can be modified as shown in FIG. 15B (only the general outline and the basic action are shown here). FIG. 15B shows an arrangement where the arrangement of the links in FIG. 15A is turned around. Accordingly, the mechanism and the input elements 3 can be arranged in a smaller space. Apart from the above arrangements, it is possible to realize as modifications an arrangement where the arrangement shown in FIG. 15A is rotated by 90 degrees, and an arrangement where the above arrangement is further turned around, which are not shown.

The constructions described above in the first to fourth embodiments are not limited to the drive mechanisms including the link mechanisms described above. For example, the movable table (movable portion) of the above drive mechanisms may be an optical element such as a mirror or a lens, or may be a retaining member for supporting a lens or a mirror, and the drive mechanism may be an optical device using the optical element. The constructions described in the first to fourth embodiments may particularly be applied to an exposure device in which an object to be subjected to exposure (hereinafter simply referred to as the "object to be exposed) is exposed with light from a light source. In this case, one of an illumination optical system in which a pattern on a mask or the like is illuminated with light from a light source, and a projection optical system for projecting the light from the pattern on the mask or the like onto the object to be exposed, may include the drive mechanism.

It is more preferable that the light source used in the above exposure device be an EUV light source (wavelength: 13 nm to 14 nm) and the atmosphere around the optical element (the atmosphere in the optical path from the light source to the mask and to the object to be exposed) be vacuum. In that case, the optical element is preferably a reflection member having formed on the surface thereof a multilayer film of a plurality of Mo films and Si films or a plurality of Mo films and Be films, and the reflectance to the EUV light is preferably 60% or more.

(Fifth Embodiment)

Figure 17:
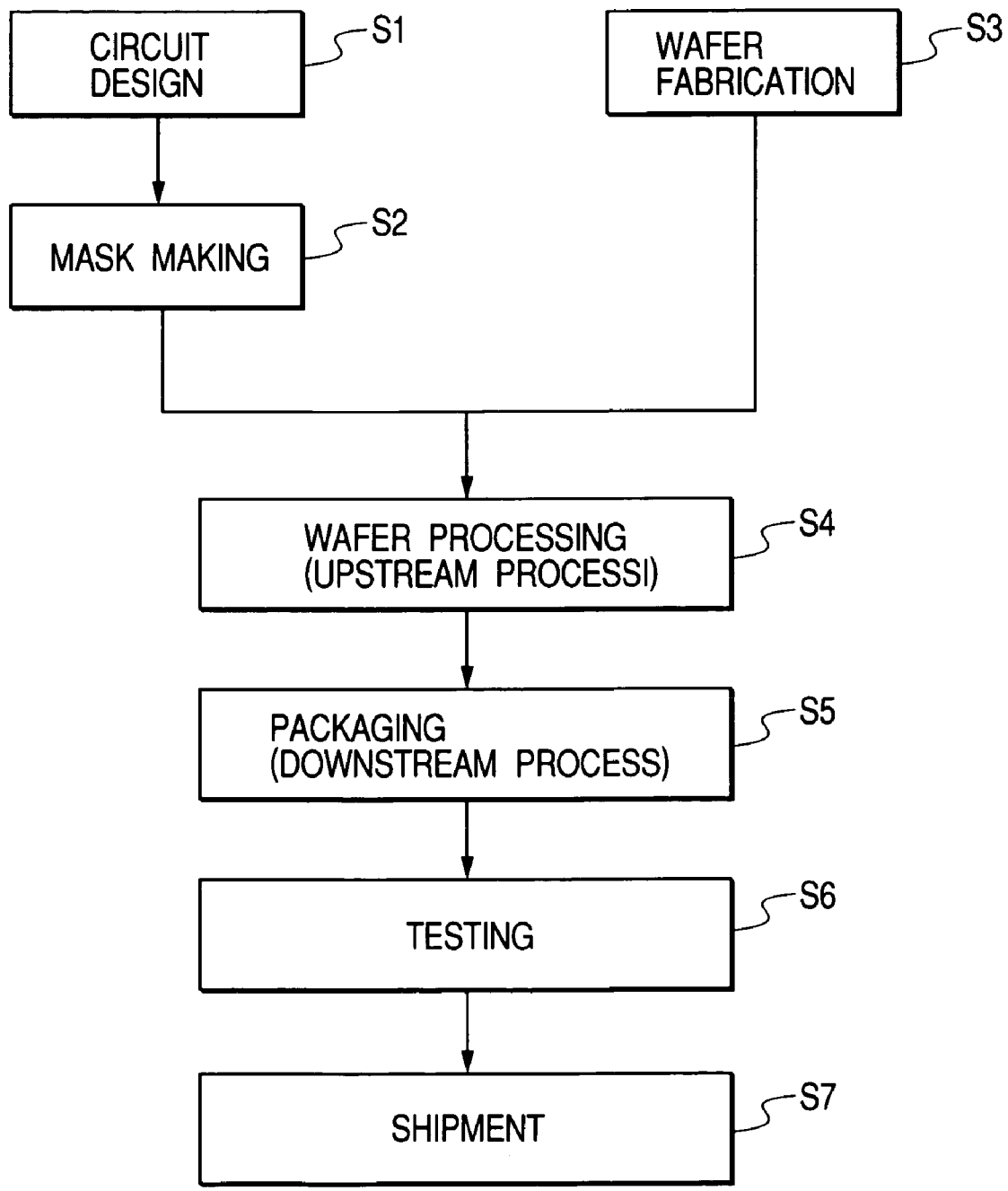
FIG. 17 is a flow chart for explaining manufacture of a device (a semiconductor chip such as an IC or LSI, an LCD, a CCD, or the like)
Figure 18:
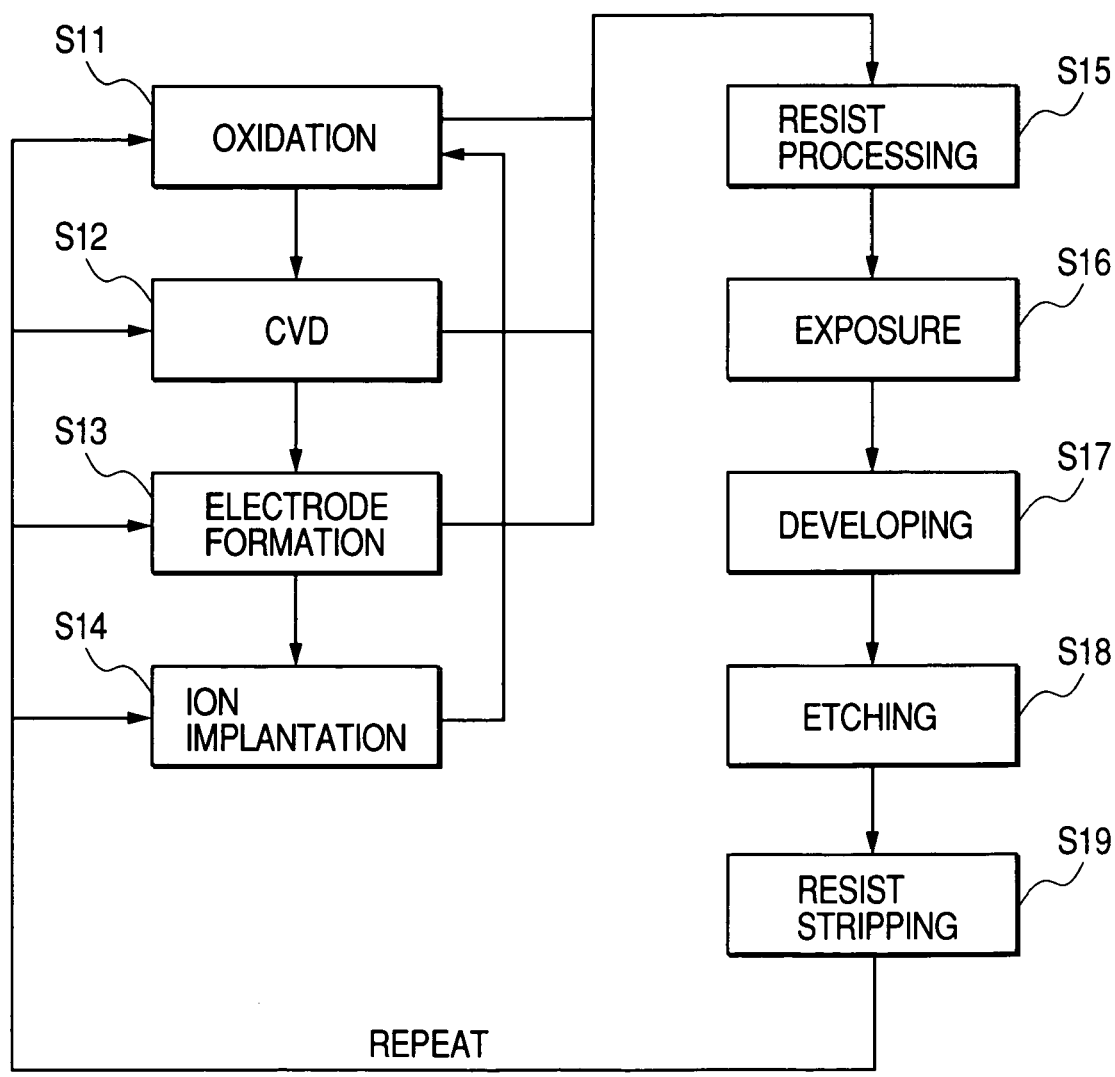
FIG. 18 is a detailed flow chart of a wafer process of step 4 shown in FIG. 17.

Next, referring to FIGS. 17 and 18, description is made on an embodiment of a device manufacturing method using the above-described exposure device (an exposure device having the above-described drive mechanism). FIG. 17 is a flow chart for describing manufacture of a device (a semiconductor chip such as an IC or LSI, an LCD, a CCD, or the like). In this embodiment, the description is directed to a case in which a semiconductor chip is manufactured. In step 1 (circuit design), circuit design of the device is performed. In step 2 (mask making), a mask having the designed circuit pattern formed therein is manufactured. In step 3 (wafer fabrication), a wafer is manufactured by using a material such as silicon. Step 4 (wafer processing) is referred to as an upstream process, in which a circuit is actually formed on the wafer through lithography by using the mask and the wafer. Step 5 (packaging) is referred to as a downstream process in which a semiconductor chip is produced by using the wafer prepared in step 4, the downstream process including an assembling process (dicing and bonding), a packaging process (chip encapsulation), and the like. In step 6 (testing), an operation test and a durability test are performed on the semiconductor device prepared in step 5. Through the above processes, the semiconductor device is completed for shipment (step 7).

FIG. 18 is a detailed flow chart of the wafer process of step 4. In step 11 (oxidation), a surface of the wafer is oxidized. In step 12 (CVD), an insulating film is formed on the surface of the wafer. In step 13 (electrode formation), an electrode is formed on the wafer by evaporation or the like. In step 14 (ion implantation), the wafer is subjected to ion implantation. In step 15 (resist processing), a photosensitive agent is applied onto the wafer. In step 16 (exposure), the circuit pattern on the mask is transferred to the wafer by exposure with an exposure device. In step 17 (developing), the wafer for which the exposure has thus been performed is developed. In step 18 (etching), portions other than the portion of a resist image thus developed are etched away. In step 19 (resist stripping), the resist, which is no longer needed as the etching has been completed, is removed. By repeating the above steps, multiple circuit patterns are formed on the wafer. According to the device manufacturing method of this embodiment, it is possible to manufacture a device with an appearance quality higher than that of the prior art. Thus, the device manufacturing method using the above-described exposure device, and the device obtained by the device manufacturing method also constitute an aspect of the present invention.

According to the above embodiments of the present invention, it is possible to provide the drive mechanism having a parallel link mechanism that is relatively isotropic and endowed with a high natural frequency, whereby high vibration blocking property can be attained as compared with the prior art.

What is claimed is:

1. A drive mechanism for driving a movable portion with respect to a stationary portion, comprising a connecting member that connects the stationary portion and the movable portion to each other, the connecting member having at least one of a monolithic planar 3-joint link mechanism and a monolithic planar 4-joint link mechanism.

2. A drive mechanism according to claim 1, further comprising a deformation member provided at least one of: between the stationary portion and the at least one of the monolithic planar 3-joint link mechanism and the monolithic planar 4-joint link mechanism; and between the movable portion and the at least one of the monolithic planar 3-joint link mechanism and the monolithic planar 4-joint link mechanism, the deformation member being capable of deforming with respect to a first direction and being a rigid body with respect to a second direction orthogonal to the first direction.

3. A drive mechanism according to claim 2, wherein the deformation member is an elastic member having one degree of freedom and capable of deforming in a rotation direction thereof.

4. A drive mechanism according to claim 1, further comprising a deformation member provided at least one of: between the stationary portion and the at least one of the monolithic planar 3-joint link mechanism and the monolithic planar 4-joint link mechanism; and between the movable portion and the at least one of the monolithic planar 3-joint link mechanism and the monolithic planar 4-joint link mechanism, the deformation member being capable of deforming with respect to a first direction and being capable of deforming also with respect to a second direction orthogonal to the first direction.

5. A drive mechanism according to claim 4, wherein the deformation member is an elastic member having two degrees of freedom and capable of deforming in a rotation direction thereof.

6. A drive mechanism according to claim 1,
wherein the monolithic planar 3-joint link mechanism has a first input link, a first connection link, a second connection link, a second input link, a first joint arranged between the first input link and the first connection link, a second joint arranged between the first connection link and the second connection link, and a third joint arranged between the second connection link and the second input link, and
wherein the drive mechanism comprises an input element for imparting a displacement to at least one of the first input link and the second input link, and controls deformation of an output portion provided in one of the first connection link and the second connection link by imparting the displacement to the at least one of the first input link and the second input link.

7. A drive mechanism according to claim 6, wherein a direction of the displacement imparted to the at least one of the first input link and the second input link is parallel to a plane defined by the first joint, the second joint, and the third joint.

8. A drive mechanism according to claim 6, wherein a direction of the displacement imparted to the at least one of the first input link and the second input link is substantially parallel to a straight line connecting between the first joint and the third joint.

9. A drive mechanism according to claim 6, wherein the first joint, the second joint, and the third joint each comprise an elastic hinge.

10. A drive mechanism according to claim 6, wherein the input element has any one of a fluid sealing means, a linear motor, and a feed screw, the fluid sealing means being one of a fluid cylinder, a piezoelectric element, and a bellows.

11. A drive mechanism according to claim 6, wherein said input element has at least two linear actuators.

12. A drive mechanism according to claim 1, wherein the monolithic planar 4-joint link mechanism has a first input link, a first connection link, an output link, a second connection link, a second input link, a first joint arranged between the first input link and the first connection link, a second joint arranged between the first connection link and the output link, a third joint arranged between the output link and the second connection link, and a fourth joint arranged between the second connection link and the second input link, and wherein the drive mechanism comprises an input element for imparting a displacement to at least one of the first input link and the second input link, and controls displacement of an output portion provided in the output link by imparting the displacement to the at least one of the first input link and the second input link.

13. A drive mechanism according to claim 12, wherein a direction of the displacement imparted to the at least one of the first input link and the second input link is substantially parallel to a plane defined by the first joint, the second joint, the third joint, and the fourth joint.

14. A drive mechanism according to claim 12, wherein a direction of the displacement imparted to the at least one of the first input link and the second input link is substantially parallel to a straight line connecting between the first joint and the fourth joint.

15. A drive mechanism according to claim 12, wherein the first joint, the second joint, the third joint, and the fourth joint each comprise an elastic hinge.

16. A drive mechanism according to claim 12, wherein the input element has any one of a fluid sealing means, a linear motor, and a feed screw, the fluid sealing means being one of a fluid cylinder, a piezoelectric element, and a bellows.

17. A drive mechanism according to claim 12, wherein said input element has at least two linear actuators.

18. A drive mechanism according to claim 1,
wherein at least three of the connecting members are provided between the stationary portion and the movable portion, and
wherein the drive mechanism performs positional control on the movable portion with respect to the stationary portion in 6 axis directions by controlling the at least three the connecting members.

19. A drive mechanism according to claim 18, further comprising a sensor that measures a relative position of the movable portion with respect to the stationary portion in the 6 axis directions,
wherein the drive mechanism performs the positional control on the movable portion with respect to the stationary portion by using an output value from the sensor.

20. A drive mechanism according to claim 19, wherein said sensor has at least six sensors.

21. An exposure device comprising:
an optical system having at least one optical element for guiding light from a light source to an object to be subjected to exposure;
a drive mechanism for driving a movable portion with respect to a stationary portion, comprising a connecting member that connects the stationary portion and the movable portion to each other, the connecting member having at least one of a monolithic planar 3-joint link mechanism and a monolithic planar 4-joint link mechanism; and
wherein the at least one optical element is at least one of an optical element supported by the movable portion, an optical element fixed substantially integrally to the movable portion and an optical element that is the movable portion.

22. A device manufacturing method comprising the steps of:
performing exposure on the object to be subjected to exposure by using an exposure device comprising an optical system having at least one optical element for guiding light from a light source to an object to be subjected to exposure, and having a drive mechanism for driving a movable portion with respect to a stationary portion, comprising a connecting member that connects the stationary portion and the movable portion to each other, the connecting member having at least one of a monolithic planar 3-joint link mechanism and a monolithic planar 4-joint link mechanism; wherein the at least one optical element is at least one of an optical element supported by the movable portion, an optical element fixed substantially integrally to the movable portion and an optical element that is the movable portion; and developing the object that has been subjected to the exposure.

23. An optical equipment comprising:

an optical system having at least one optical element for guiding light; and a drive mechanism for driving a movable portion with respect to a stationary portion, comprising a connecting member that connects the stationary portion and the movable portion to each other, the connecting member having at least one of a monolithic planar 3-joint link mechanism and a monolithic planar 4-joint link mechanism; and wherein the at least one optical element is at least one of an optical element supported by the movable portion, an optical element fixed substantially integrally to the movable portion and an optical element that is the movable portion.

24. A drive mechanism for driving a movable portion with respect to a stationary portion, comprising a connecting member that connects the stationary portion and the movable portion to each other, the connecting member having at least one of a monolithic plate-like 3-joint link mechanism and a monolithic plate-like 4-joint link mechanism.

25. A drive apparatus for driving an optical element with respect to a stationary portion, comprising at least three connecting members that connect the optical element and the stationary portion to each other, the connecting member having at least two linear actuators and a monolithic plate-like link mechanism which is connected to the linear actuators and transmits a displacement caused by the linear actuators to the optical element, wherein the link mechanism has at least three joints and positions the optical element in 6 axis directions by controlling the linear actuators.

* * * * *